(12) United States Patent
Watanabe et al.

(10) Patent No.: US 8,737,087 B2
(45) Date of Patent: May 27, 2014

(54) MULTILAYER PRINTED WIRING BOARD AND MANUFACTURING METHOD OF MULTILAYER PRINTED WIRING BOARD

(71) Applicant: Ibiden Co., Ltd., Ogaki (JP)

(72) Inventors: Yasuhiro Watanabe, Ogaki (JP);
Michimasa Takahashi, Ogaki (JP);
Masakazu Aoyama, Ogaki (JP);
Takenobu Nakamura, Ogaki (JP);
Hiroyuki Yanagisawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/729,870

(22) Filed: Dec. 28, 2012

(65) Prior Publication Data
US 2013/0112469 A1   May 9, 2013

Related U.S. Application Data

(60) Continuation of application No. 12/555,305, filed on Sep. 8, 2009, now Pat. No. 8,353,103, which is a division of application No. 11/250,531, filed on Oct. 17, 2005, now Pat. No. 7,626,829.

(30) Foreign Application Priority Data

Oct. 27, 2004 (JP) .................................. 2004-312791

(51) Int. Cl.
*H05K 7/10* (2006.01)
(52) U.S. Cl.
USPC ........... 361/767; 361/760; 361/768; 361/771; 174/261; 174/262

(58) Field of Classification Search
USPC .......... 174/250, 260–263; 361/250, 260–263, 361/760, 767, 768, 777, 783, 807, 808
See application file for complete search history.

(56) References Cited

U.S. PATENT DOCUMENTS

| | | | |
|---|---|---|---|
| 6,217,987 B1 | 4/2001 | Ono et al. | 428/209 |
| 6,365,843 B1 | 4/2002 | Shirai et al. | 174/262 |
| 6,698,648 B2 | 3/2004 | Wunderlich et al. | 228/218 |
| 6,809,415 B2 | 10/2004 | Tsukada et al. | 257/693 |
| 7,339,260 B2 * | 3/2008 | Sugimoto et al. | 257/668 |
| 2001/0026888 A1 | 10/2001 | Yokoyama et al. | |
| 2003/0043556 A1 * | 3/2003 | Sugimoto et al. | 361/760 |
| 2003/0052157 A1 | 3/2003 | Wunderlich et al. | 228/254 |

(Continued)

FOREIGN PATENT DOCUMENTS

| | | |
|---|---|---|
| EP | 1 194 022 A1 | 4/2002 |
| GB | 2 300 524 A | 11/1996 |

(Continued)

*Primary Examiner* — Hoa C Nguyen
(74) *Attorney, Agent, or Firm* — Oblon, Spivak, McClelland, Maier & Neustadt, L.L.P.

(57) ABSTRACT

This invention provides a multilayer printed wiring board in which electric connectivity and functionality are obtained by improving reliability and particularly, reliability to the drop test can be improved. No corrosion resistant layer is formed on a solder pad 60B on which a component is to be mounted so as to obtain flexibility. Thus, if an impact is received from outside when a related product is dropped, the impact can be buffered so as to protect any mounted component from being removed. On the other hand, land 60A in which the corrosion resistant layer is formed is unlikely to occur contact failure even if a carbon pillar constituting an operation key makes repeated contacts.

18 Claims, 18 Drawing Sheets

(56) References Cited

U.S. PATENT DOCUMENTS

| | | |
|---|---|---|
| 2003/0164303 A1 | 9/2003 | Huang et al. |
| 2004/0060169 A1 | 4/2004 | Yokoyama et al. |
| 2004/0226745 A1 | 11/2004 | En .................................. 174/262 |
| 2005/0039948 A1 | 2/2005 | Asai et al. ....................... 174/262 |

FOREIGN PATENT DOCUMENTS

| | | |
|---|---|---|
| JP | 10-013028 | 1/1998 |
| JP | 2000-332395 | 11/2000 |
| JP | 2001-283805 | 10/2001 |
| JP | 2002-134885 | 5/2002 |
| JP | 2003-36908 | 2/2003 |
| JP | 2004-134418 | 4/2004 |
| JP | 2004-158888 | 6/2004 |
| JP | 2004-172415 | 6/2004 |
| JP | 2004-207381 | 7/2004 |
| KR | 2001-0041267 | 5/2001 |
| WO | WO99/44403 | 9/1999 |

* cited by examiner

Fig. 10

Evaluation result of Example and Comparative Example

| Item | Reliability test | Start up test | Drop test | | |
|---|---|---|---|---|---|
| | | | One time | Three times | Five times |
| Example 1-1 | 5000 CYCLE | ○ | ○ | ○ | ○ |
| Example 1-2 | 4500 CYCLE | ○ | ○ | ○ | △ |
| Example 1-3 | 5000 CYCLE | ○ | ○ | ○ | ○ |
| Example 1-4 | 5000 CYCLE | ○ | ○ | ○ | ○ |
| Comparative Example 1-1 | 4000 CYCLE | ○ | ○ | △ | × |

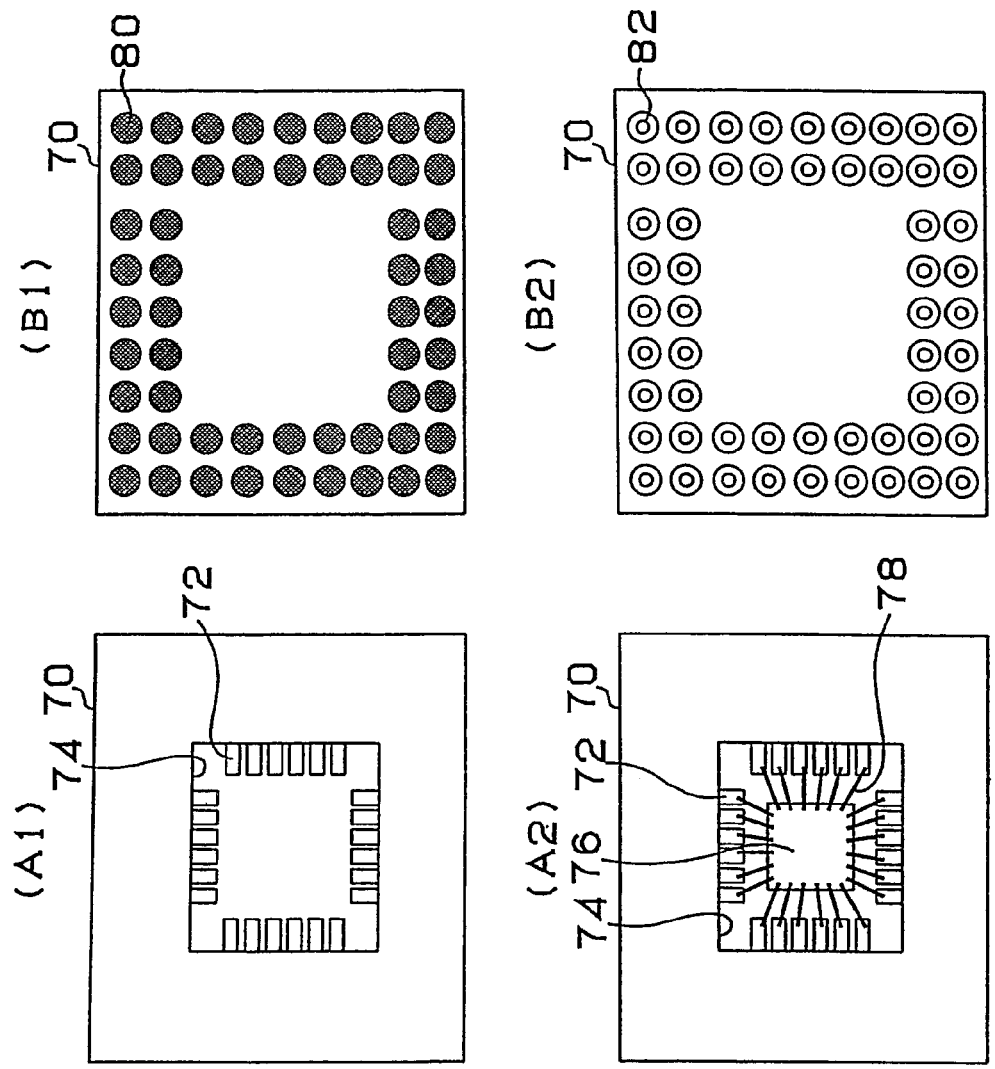

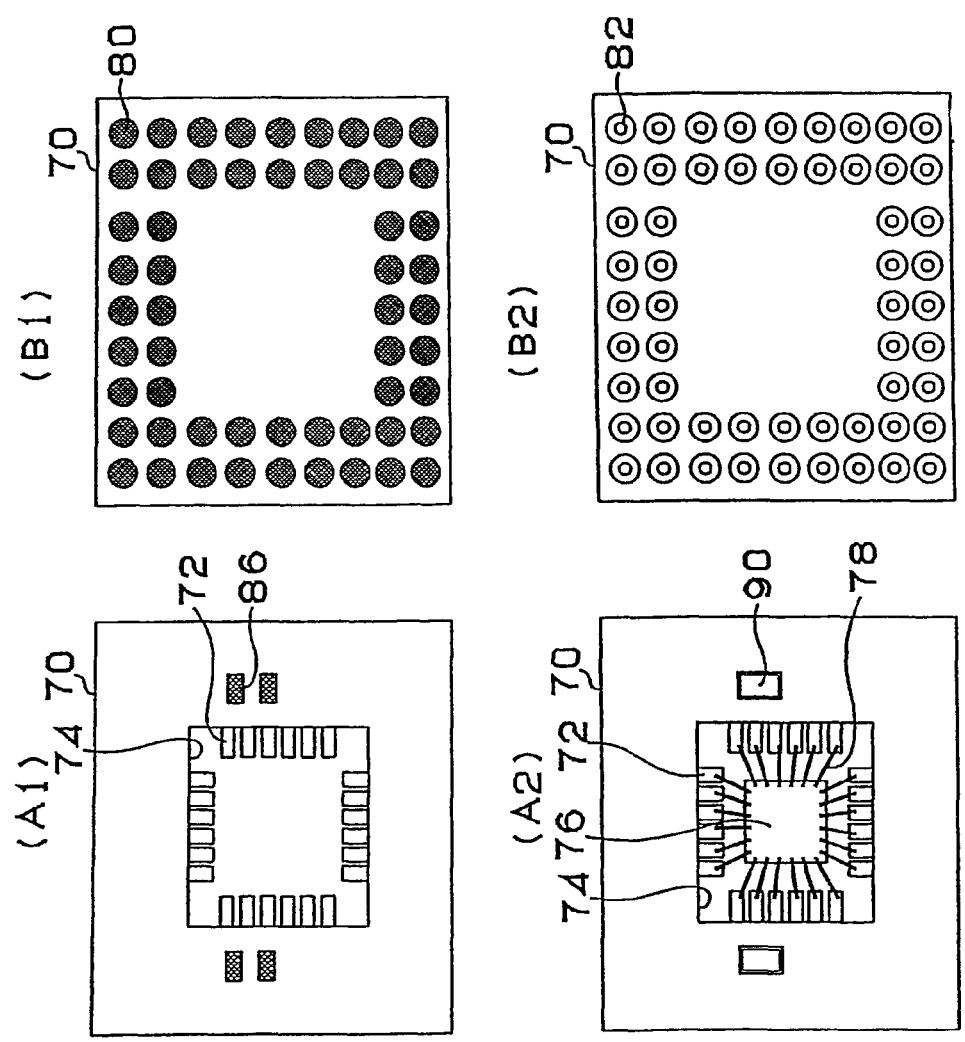

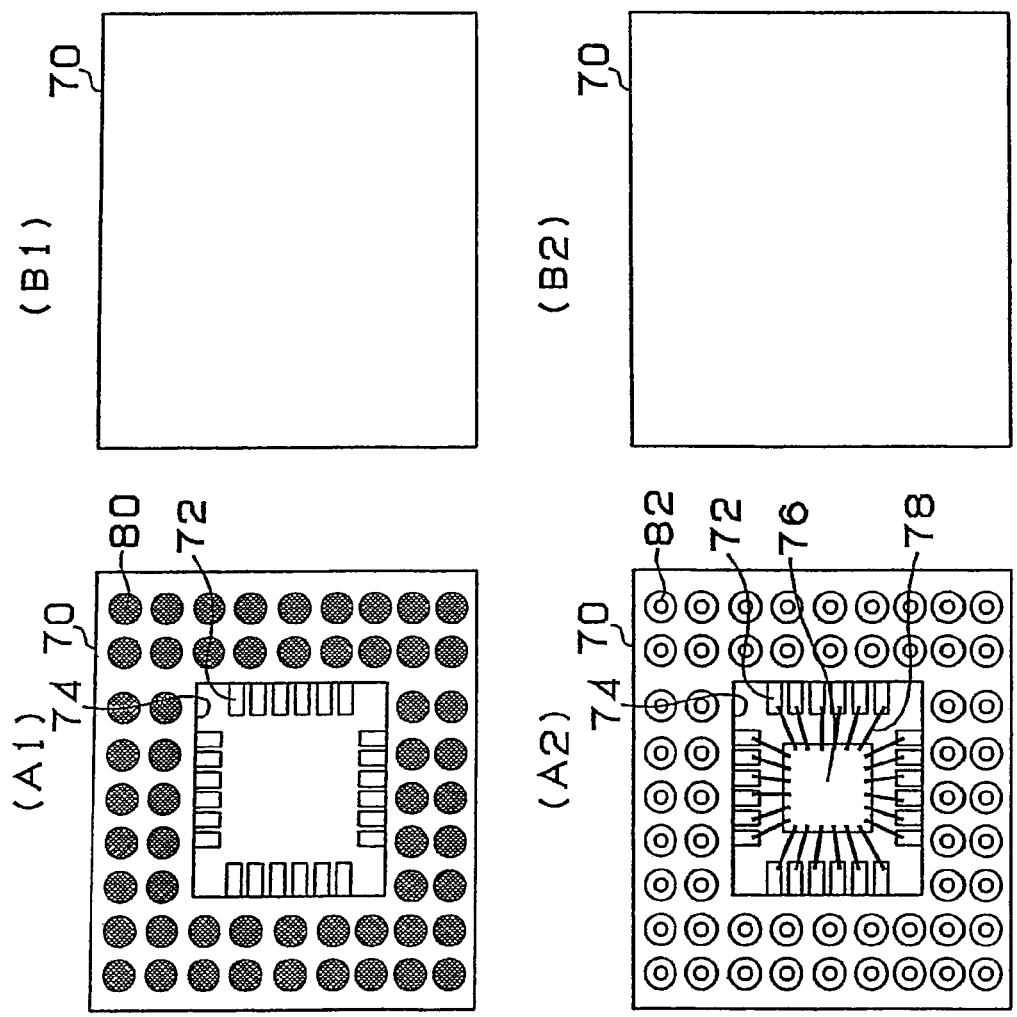

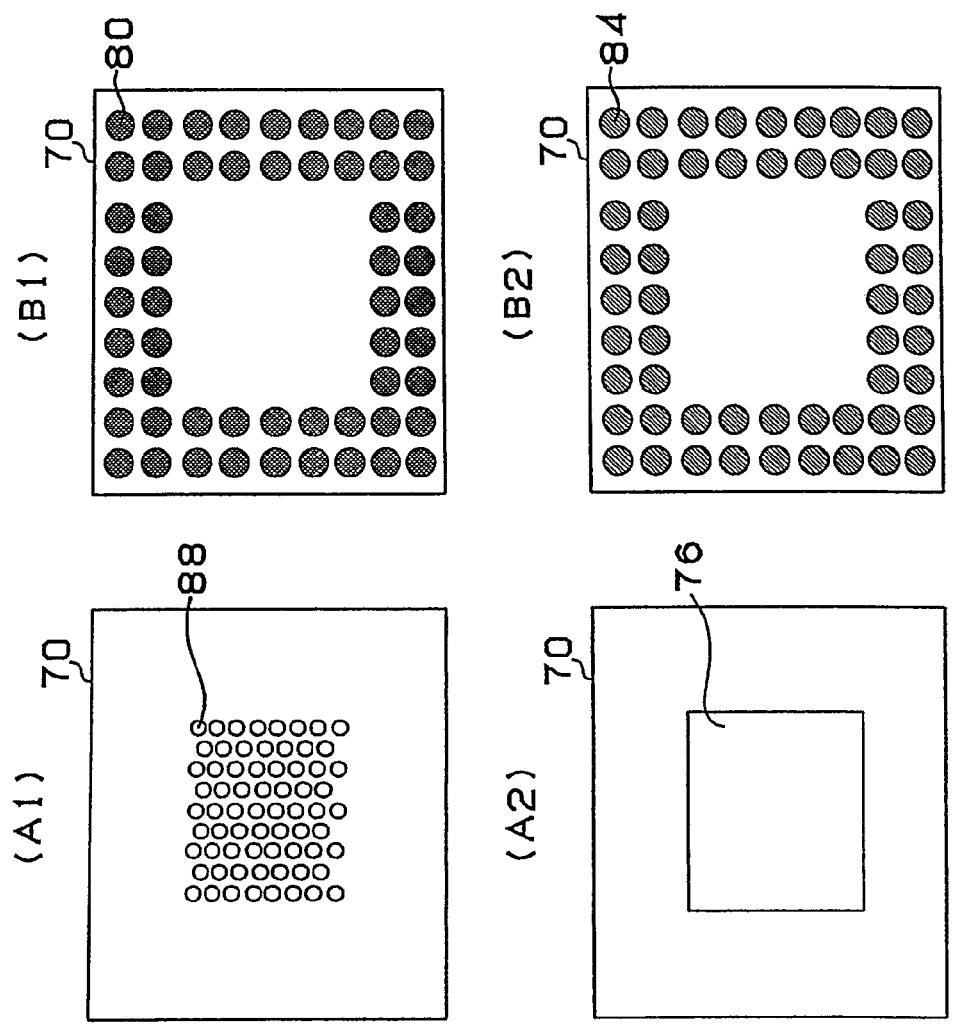

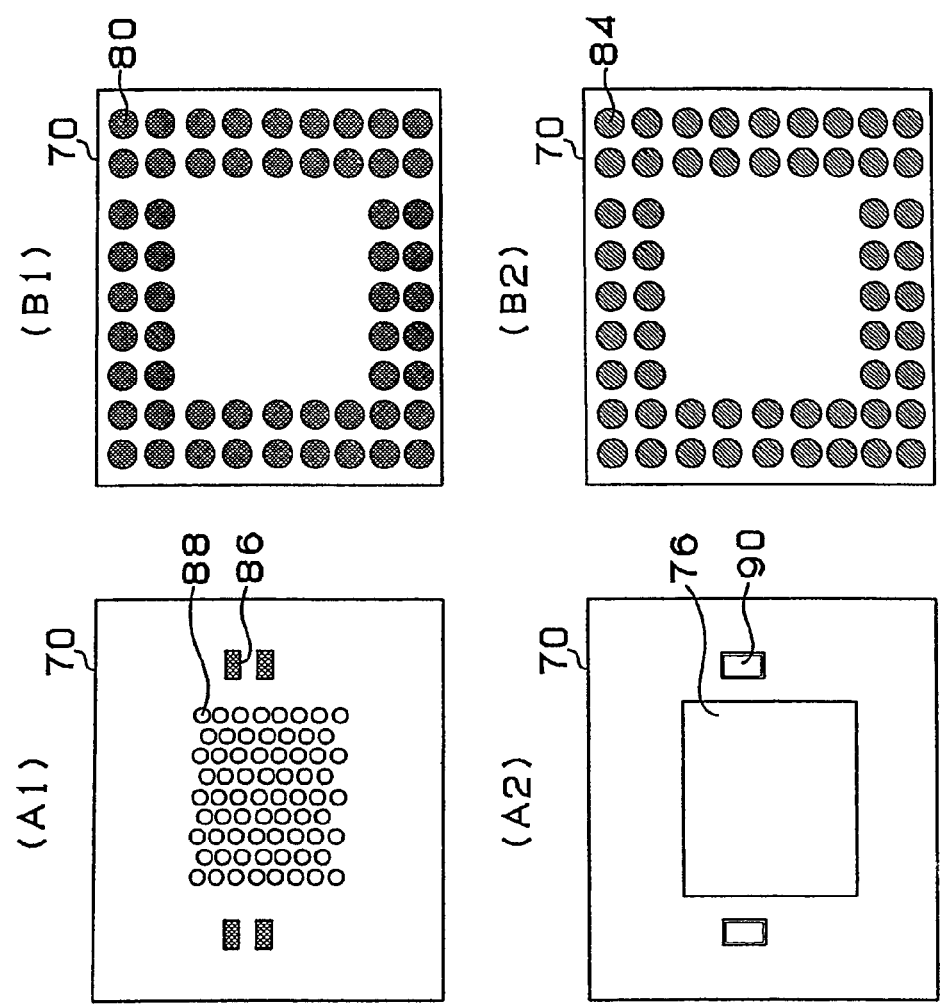

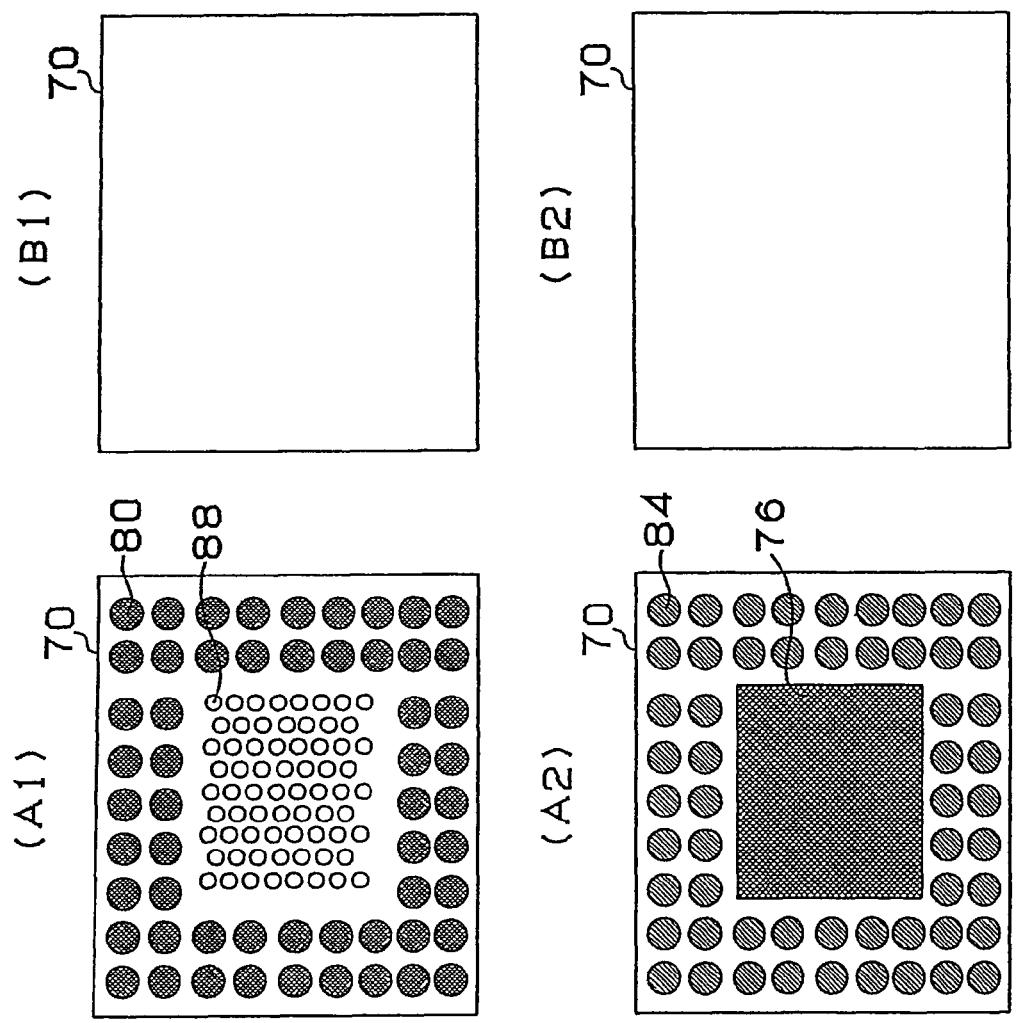

Fig. 18

Evaluation result of Example 2 and Comparative Example 2

| Item | Reliability test | Continuity test | | Reliability test after mounted |
|---|---|---|---|---|
| | | Resistant change | Observation of cross section | |
| Example 2 − 1 − 1 | 5 0 0 0 | None | None | 5 0 0 0 |
| Example 2 − 1 − 2 | 4 5 0 0 | None | None | 4 0 0 0 |
| Example 2 − 1 − 3 | 5 0 0 0 | None | None | 5 0 0 0 |
| Example 2 − 2 − 1 | 5 0 0 0 | None | None | 5 0 0 0 |
| Example 2 − 3 − 1 | 5 0 0 0 | None | None | 5 0 0 0 |
| Example 2 − 4 − 1 | 4 5 0 0 | Observed | None | 4 0 0 0 |
| Example 2 − 4 − 2 | 4 0 0 0 | None | None | 4 0 0 0 |
| Example 2 − 4 − 3 | 4 5 0 0 | None | None | 4 0 0 0 |
| Example 2 − 5 − 1 | 4 5 0 0 | None | None | 4 0 0 0 |
| Example 2 − 6 − 1 | 4 5 0 0 | None | None | 4 0 0 0 |
| Comparative Example 2 − 1 | 3 5 0 0 | Observed | Observed | 3 0 0 0 |
| Comparative Example 2 − 2 | 3 5 0 0 | Observed | Observed | 3 0 0 0 |

MULTILAYER PRINTED WIRING BOARD AND MANUFACTURING METHOD OF MULTILAYER PRINTED WIRING BOARD

The present application is a continuation of and claims the benefit of priority to U.S. application Ser. No. 12/555,305, filed Sep. 8, 2009, the entire contents of which are incorporated herein by reference. U.S. application Ser. No. 12/555,305 is a division of and claims the benefit of priority from U.S. application Ser. No. 11/250,531, filed Oct. 17, 2005, now U.S. Pat. No. 7,626,829, issued on Dec. 1, 2009, which is based upon and claims the benefit of priority from prior Japanese Application No. 2004-312791, filed Oct. 27, 2004.

BACKGROUND OF THE INVENTION

1. Field of the Invention

The present invention relates to a multilayer printed wiring board in which electronic components, semiconductor device and the like are mounted on the front face of a board thereof and a manufacturing method thereof and more particularly a multilayer printed wiring board preferably used for portable telephone, portable electronic appliance, electronic package and the like and a manufacturing method thereof.

2. Description of the Related Art

A unit of the circuit board is formed by drilling via holes in an insulation hard base material having a conductive circuit on at least one face and then forming conductive layer in their openings with metallic paste or plating. A multilayer circuit board (multilayer printed wiring board) can be obtained by preparing two or more pieces of these circuit boards and bonding those boards successively or collectively such that they are overlaid into multi-layers. At this time, because a via hole or a land of the via hole of one circuit board is connected to a conductive circuit or a land of the other circuit board, these two circuit boards are electrically connected. In other region in which no electrical connection is performed, circuit boards are fitted to each other with an adhesive layer composed of thermoplastic resin or prepreg. As a conventional art relating to these, Japanese Patent Application Laid-Open No. 10-13028 can be mentioned.

A solder resist layer for protecting the conductive circuit is formed on the front face of the board or a general printed wiring board and solder pads are formed by opening part of the solder resist layer. By exposing the conductive circuit through that opening, a corrosion resistant layer such as nickel-gold is formed on its front layer. The corrosion-resistant layer is formed on all the solder pads and solder is formed on a conductive circuit covered with the corrosion-resistant layer and then an electronic component is mounted thereon.

In case of portable electronic appliances such as portable telephone, digital camera in recent years, with intensified desires for higher function and higher density and reduction in size of components to be mounted, the wiring density (line/space) in a mounting board or the size of the solder pad has been reduced so as to correspond to such desires for higher density of the components. On the formed board, solder pads of an electronic component (passive component such as semiconductor, capacitor, resistor, inductor), display devices such as liquid crystal display and digital display, operation devices such as key pad and switch, and external terminals of USB, ear phone and the like are mixed and these components are mounted on the solder pad via solder. Another solder pad allows an electronic appliance to be operated by making such an operation device as a switch into contact with the pad.

In case of a package board in which an IC chip is mounted on a printed wiring board as a bare chip as well, with intensified desire for higher function, higher density and enhanced reduction in size of a component to be mounted, desires for higher density of components have been met by decreasing wiring density (line/space) or decreasing the solder pad. The size of the board has been desired to be of chip size package (CSP) which is similar to the size of the IC chip. As a result, the package mounting region when it is mounted on a mother board decreases so that the mounting region for other components is obtained thereby making it possible to obtain a higher density mounting board. Further, by loading such an electronic component as capacitor and resistor on the package board, the high frequency of the IC chip can be met so as to obtain the function and performance of the package board.

Further, by mixing the IC chip and electronic components on a same package board, high frequency and high functional properties are obtained so as to exert the function and performance of the package board effectively.

An object of the present invention is to provide a multiplayer printed wiring board and a manufacturing method thereof, which capable of obtaining functionality and securing electric connectivity.

A multilayer printed wiring board in which a conductive circuit is formed on the front face thereof; solder-resist layer covering the conductive circuit is formed; a plurality of solder pads is formed through a plurality of openings in the solder resist which exposes part of the conductive circuit; and a corrosion resistant layer is formed on the front face of the conductive circuit, wherein
a corrosion resistant layer formation pad in which the corrosion resistant layer is formed and a corrosion resistant layer non-formation pad in which no corrosion resistant layer is formed coexist as said solder pad.

A multilayer printed wiring board in which interlayer connection is achieved through a via hole; at least two layers are overlaid with the via hole filled with a conductive layer; a solder resistant layer is formed on the front face; a plurality of solder pads is formed through a plurality of openings in the solder resist which expose part of the conductive circuit; and corrosion resistant layer is formed on the front face of the conductive circuit, wherein
the corrosion resistant layer formation pad in which corrosion resistant layer is formed and corrosion resistant layer non-formation pad in which no corrosion resistant layer is formed coexist as said solder pad.

The multilayer printed wiring board including a portion in which a corrosion resistant layer is formed and a portion in which no corrosion resistant layer is formed mixedly in its conductive layer exposed on the front face thereof can obtain reliability more easily than a conventional multilayer printed wiring board in which the corrosion resistant layer is formed on all conductive portions exposed on the front face. When an IC chip is installed or under heat cycle condition or under high temperature at high humidity, its board is elongated/contracted due to an influence of temperature. Because the surface of the board is under the same condition in the conventional multilayer printed wiring board in which the corrosion resistant layer is formed on all conductive portions exposed on the front face, stress generated by elongation/contraction is transmitted easily. Thus, the stress is difficult to buffer. However, in the multilayer printed wiring board having solder pads in which the corrosion resistant layer is formed partially, the generated stress is difficult to transmit. As a consequence, the stress is easy to buffer. For the reason, the multilayer printed wiring board of the present invention can obtain reliability more easily for a long term as compared to the conventional printed wiring board.

Because stress is buffered more as compared to the conventional printed wiring board in evaluating its electric connectivity and reliability upon drop test, the degree of deterioration decreases. As a result, reliability can be obtained more easily.

Because stress is buffered according to the present invention, warping is more difficult to generate in the multilayer printed wiring board, so that flatness of the surface of the board is obtained. Therefore, in a package board in which an IC chip is mounted as a bare chip, connectivity with the IC chip and connectivity with an external board are easy to obtain. Further, in a package board in which the IC chip and an electronic component such as a capacitor are mounted mixedly on the front face, connectivity between the IC chip and the electronic component can be obtained easily.

In a portion in which the corrosion resistant layer is formed, stiffness of the board is obtained more than a portion in which no corrosion resistant layer is formed. Because stiffness is obtained, fault of the printed wiring board like the warping of the board can be suppressed and when a component is mounted, contact failure or non-connection is difficult to generate between a conductive portion of the solder pad and an external terminal of any component. Because any mounting component is disposed on the corrosion resistant layer having stiffness, it is stabilized. Further, because an operation component such as a key pad makes contact with a land portion in which the corrosion resistant layer is formed, contact failure is difficult to occur despite repeated contacts.

Conversely, the portion in which no corrosion resistant layer is formed is more flexible than a portion in which the corrosion resistant layer is formed. Because of the flexibility, stress generated due to elongation/contraction is buffered and reliability against fault such as crack in the conductive circuit, the solder and insulation layer is easier to obtain than the conventional printed wiring board. Even if an impact is received from outside, a portion in which no corrosion resistant layer is formed can buffer that impact. Thus, any mounted component turn unlikely to receive the impact, so that faults such as drop of component become unlikely to occur.

On heating process at the time of manufacturing of the printed wiring board by hardening or reflow, the printed wiring board accompanies elongation/contraction due to heat (as an example, elongated as temperature rises and contracted when it returns from a high temperature to the normal temperature) and the portion in which no corrosion resistant layer is formed more unlikely undergoes a fault such as crack in a conductive circuit or the insulation layer as compared to the portion in which the corrosion resistant layer is formed. A fault such as crack in the solder layer is more difficult to occur. The reason is estimated to be that with elongation/contraction, the generated stress is buffered or the generated stress is more difficult to concentrate locally so that a fault such as crack is more difficult to occur. The same inclination was seen in the size (meaning vertical and horizontal sizes), thickness, quantity of layers, and material of a printed board.

The area of the portion in which the corrosion resistant layer is formed is desired to be larger than the portion in which no corrosion resistant layer is formed. The reason is that the stiffness of the board itself is easier to obtain if the area of the portion in which the corrosion resistant layer is formed is increased.

The corrosion resistant layer refers to a layer composed of one or more layers with one or more metals selected from gold, silver, platinum and the like or a layer composed of one or more layers each in which noble metals and other metals are combined. More specifically, nickel-gold, nickel-silver, nickel-platinum, gold (single layer), silver (single layer), nickel-palladium-gold, nickel-palladium-silver and the like can be mentioned.

The conductive circuit exposed from the solder pad portion may be a flat circuit, a circuit having a concavity, a circuit having a protrusion, a circuit having a roughened layer on its front face or the like.

In a condition in which such a printed wiring board is incorporated in a casing of a portable electronic appliance, a plurality of startup and driving components like semiconductor component such as MPU, capacitor and resistor, display devices such as a liquid crystal display and a digital display, an operation device such as a key pad, a switch and an external terminals such as USB, ear phone are mounted, thereby executing a role of the electronic appliance. These electronic appliances are intended to be carried with and it is supposed that it may be dropped on the ground.

The present invention can be applied to a printed wiring board in which interlayer connection is achieved through via holes, a board manufactured according to a subtractive method, a board manufactured according to an additive method and other various type printed wiring boards. Additionally, it is applicable to a board manufactured according to a conformal processing method.

The solder pad in this case includes not only a conductive circuit exposed from an opening in the solder-resist layer but also a dummy conductive layer not electrically connected, an alignment mark, a conductive layer formed to recognize a product and a terminal conductive layer for switch.

The solder pad in which the corrosion resistant layer is formed is desired to be an external terminal mainly. As a result, in the portion in which the corrosion resistant layer is formed, stiffness of the board is obtained more as compared to the portion in which no corrosion resistant layer is formed. Because stiffness is obtained, a fault of the printed wiring board such as warping of a board can be suppressed and if an external terminal is mounted, contact failure or non connection is unlikely to occur between a conductive portion of the solder pad and an external terminal of a component. Further, because the external terminal is disposed on a pad in which the corrosion resistant layer is formed, its installation is stabilized. In case of an operation component having a movable contact point which is an external terminal, like a key pad, its strength is intensified by the stiffness of that pad portion to allow repeated contact to the solder pad. Contact failure is difficult to be induced even if such an external terminal contacts repeatedly.

The solder pad in which no corrosion resistant layer is formed is desired to be an electronic component mounting terminal.

The solder pad portion in which no corrosion resistant layer is formed is more flexible than the portion in which the corrosion resistant layer is formed. When an impact is received from outside, the portion in which no corrosion resistant layer is formed can buffer that impact because it has flexibility. When an impact is received from outside due to the solder pad in which no corrosion resistant layer is formed is used at an electronic component mounting terminal, removal is difficult to occur between a conductive circuit exposed from the solder pad and an electronic component. Particularly, because the impact is buffered by the solder layer for joining them as well, crack is unlikely to occur in the solder layer so that removal is difficult to occur.

Because connectivity of the component is obtained as a result, electric connectivity or functionality as a product is not lowered and the reliability is no lower than the conventional printed wiring board. The electronic component for use at an electronic component mounting terminal includes an active component such as semiconductor and a passive component such as a capacitor, a resistor and an inductor.

The solder pad in which the corrosion resistant layer is formed is desired to be a connection pad to which the IC chip is to be connected as a bare chip mainly. Particularly, it is desired to be a wire-bonding pad or a connection solder pad for mounting the IC chip by flip chip bonding.

Because the connecting pad for the IC chip in which the corrosion resistant layer is formed is formed in a connecting region with the IC chip, stiffness of a board is obtained. Because stiffness is obtained, any fault of the printed wiring board such as warping of its board can be suppressed and even if any component is mounted, contact failure or no connection is unlikely to occur between the conductive portion of the solder pad and the external terminal of a component.

In wire bonding, formation of the corrosion resistant layer is desirable to add bonding resistance of the pad portion and metal junction. Further, because flatness of a bonding pad is held by the corrosion resistant layer, any fault is unlikely to occur at the time of bonding. Because flatness of the bonding pad is obtained, connectivity and reliability are obtained.

By forming the corrosion resistant layer upon installing the IC chip as a bare chip by flip chip bonding, the configuration and the quantity of solder bumps or metal bumps for IC chip connection formed on the pad are stabilized, thereby stabilizing connection at the time of reflow. Additionally, connectivity and reliability are obtained.

The solder pad in which no corrosion resistant layer is formed is desired to be an electronic component mounting terminal.

Conversely, the portion in which no corrosion resistant is formed is more flexible than the portion in which the corrosion resistant layer is formed. Because of the flexibility, stress generated due to elongation/contraction by heat is buffered and reliability against a fault such as crack in the conductive circuit or the insulation layer is kept for a longer term than the conventional printed wiring board. When an impact is received from outside, the portion in which no corrosion resistant layer is formed can buffer that impact. Thus, any mounted component becomes unlikely to receive the impact, so that a fault such as drop of component becomes unlikely to occur.

If a solder pad for IC chip connection and a solder pad for electronic component connection are formed on a same face of a package board, it is desirable that corrosion resistant layer is formed on the solder pad for IC chip connection while no corrosion resistant layer is formed on the solder pad for electronic component connection. As a result, if warping of a board is suppressed, an influence of the impact from outside can be buffered as compared with the conventional package board. Thus, connection with the IC chip or the electronic component mounted on the front face of the package board is obtained to protect connectivity and reliability from dropping.

An external terminal (for example, pin terminal as PGA or ball terminal as BGA) for connecting to an external board is disposed on the package board and in this case, it is desirable that no corrosion resistant layer is formed on the solder pad of that external connecting terminal. As a consequence, stress such as thermal stress generated when the external terminal is installed is buffered so that generation of a fault such as crack in the conductive material of solder for connection is suppressed, thereby obtaining connection between the connecting terminal and the board. Further, connectivity with the external board and reliability about that are easy to obtain.

The external terminals of the present invention may be disposed on a same plane as the IC chip to be mounted or on an opposite face side to the IC chip. In this case, it is permissible to dispose a region in which corrosion resistant layer is formed and a region in which no corrosion resistant layer is formed on the same plane or dispose the region in which the corrosion resistant layer is formed and the area in which no corrosion resistant layer is formed each on opposite side face. Depending on a case, it is permissible to dispose these regions mixedly.

It is desirable to provide an organic solderability preservative (OSP) (pre-flux) layer on a solder pad in which no corrosion resistant layer is formed. As a result, oxidation and the like of the conductive circuit and conductive layer is prevented until solder is installed. When solder is installed, the OSP layer is removed thereby not hampering electric connectivity. Other covering layer than the OSP layer may be applied. As an example of the OSP layer, it is permissible to use substances composed of mainly imidazole compound (for example, alkyl benz-imidazol, benz-imidazol). Metallic ion (for example, copper ion, silver ion, nickel) or organic acid may be contained. By dipping a printed wiring board whose solder pads are exposed in this solution kept between the normal temperature and heating temperature (for example, 80° C.), an organic film is applied on a copper circuit exposed from the solder pads. Solderability is obtained with this organic film. Other organic film may be used as long as it is formed on a conductor and can be removed by heating.

A manufacturing method of a multilayer printed wiring board in which a solder-resist layer covering the conductive circuit on the front face thereof is formed; a plurality of solder pads is formed through a plurality of openings in the solder resist which expose part of the conductive circuit; and a corrosion resistant layer is formed on the front face of the conductive circuit, comprising at least steps (a) to (e):

step (a) of forming a solder resist on the front face of printed wiring having a conductive circuit;

step (b) of forming a solder pads by exposing/developing the solder resist or an opening with laser;

step (c) of forming a mask layer for covering the solder pad on the solder resist layer in which the solder pads are formed;

step (d) of forming a corrosion resistant layer on the solder pads in a non-formation portion of said mask layer; and step (e) of obtaining a plurality of solder pads including a corrosion resistant layer formation solder pads in which corrosion resistant layer is formed and corrosion resistant layer non-formation solder pads in which no corrosion resistant layer is formed mixedly by removing the mask resist layer.

According to the above-described manufacturing method, a multilayer printed wiring board in which a portion including the corrosion resistant layer and a portion including no corrosion resistant layer coexist in a conductive layer whose face is exposed can be manufactured. According to the printed wiring board obtained by the manufacturing method of the invention, its reliability is easier to obtain as compared with the conventional multilayer printed wiring board in which the corrosion resistant layer is formed on all the conductive portion exposed on the face.

Because stress is buffered, which is testified by evaluating the electric connectivity and reliability through a drop test, the degree of deterioration can be reduced. As a result, the reliability is hard to drop.

In the process (C), the solder pad to be covered with mask layer is desired to be an electronic component mounting pad or an external terminal connecting pad.

By covering with the mask layer, a corrosion resistant layer non-formation solder pad portion in which no corrosion resistant layer is formed can be formed. That corrosion resistant layer non-formation solder pad portion is more flexible than a portion in which the corrosion resistant layer is formed. When an impact is received from outside, the portion in which no corrosion resistant layer is formed can buffer that impact because it has flexibility. By using the solder pad in which no corrosion resistant layer is formed for an electronic component mounting terminal, an electronic component is protected from dropping from a conductive circuit exposed from the solder pad when an impact is received from outside. Particularly, because the impact is buffered by the solder layer for joining those, a crack in the solder layer is hard to occur so that the electronic component or the external terminal is protected from dropping.

As a consequence, connectivity with a component or external terminal is obtained, thus, electric connectivity and functionality as a product are obtained and reliability is easy obtained.

The mask layer can cover the solder pad in which no corrosion resistant layer is formed, through exposure/development or drilling by laser. That is, a portion in which the mask layer is to be formed and a portion in which the mask layer is not to be formed are formed on the front face of a board covered with the solder resist layer and a plating film is applied to the mask layer non-formation portion. The mask layer is formed by coating with resin whose viscosity is adjusted preliminarily or bonding dry film. The mask layer is formed in a region in which no corrosion resistant layer is formed and no corrosion resistant layer is formed on a solder pad located under the mask layer. An opening is made in the mask layer by exposure/development or by laser in other solder pad region.

As a consequence, the mask layer non-formation portion is formed on the solder resist layer and corrosion resistant layer is formed on the solder pad in the non-formation area. As a consequence, the portion in which the corrosion resistant layer is formed and the portion in which no corrosion resistant layer is formed can be formed on the solder pad.

After the process (e), it is permissible to form the OSP layer on the solder pad in which no corrosion resistant layer is formed.

It is desirable to provide organic solderability preservative (OSP) (pre-flux) layer on the solder pad in which no corrosion resistant layer is formed. As a consequence, oxidation and the like of the conductive circuit and the conductive layer is inhibited until the solder is installed. Then, when the solder is installed, the OSP layer is removed not to hamper electric connectivity.

The above-described manufacturing method enables the multilayer printed wiring board for package board to be manufactured. As an example, the corrosion resistant layer is formed on a solder pad for mounting a bare chip for the IC chip and the corrosion resistant layer is not formed on a solder pad for an electronic component such as a capacitor. These portions may be provided on a same face.

Thus, the mask layer is applied to the solder pad for electronic component mainly. As a consequence, no corrosion resistant layer is formed on that given solder pad.

Each of the following processes will be described in detail. Process (a) for forming solder resist on the front layer of a printed wiring board having a conductive circuit and process (b) for forming solder pad by exposing/developing on the solder resist or drilling by laser will be described. The solder resist layer is formed on a printed wiring board in which a dummy conductive layer not connected electrically with a land containing a conductive circuit or a conductive layer for recognizing an alignment mark, product is formed on a single face or both faces. If it is needed, blackening or roughening may be executed on the conductive circuit and the conductive layer. The printed wiring board mentioned here refers to a printed wiring board in which interlayer connection is achieved through via holes, a board manufactured according to the subtractive method, a board manufactured according to the additive method and other various type printed wiring boards.

Solder resist is formed by applying resin whose viscosity is adjusted preliminary or bonding dry-film-like film or pressing that film by heat. The thickness of the formed solder resist is 10-50 μm and the thickness of the solder resist after completely hardened is 5-50 μm. As the solder resist, heat hardening resin, thermoplastic resin, photopolymerizing polymer, resin produced by converting part of heat hardening resin to (meta) acrylic and compound of these resins are used and of them, it is desirable to use epoxy resin, polyimide resin, phenol resin, polyolefin resin, phenoxy resin and the like. If it is needed, formed solder resist layer may be dried at 80 to 100° C. As a consequence, the solder resist layer is turned to semi-hardened (B stage) state.

After that, with a mask on which solder pads are drawn placed on the solder resist layer, ultraviolet ray or the like is irradiated and openings of the solder pads are made in the solder resist layer by development with chemical such as alkali solution. Alternatively, the openings of the solder pads are made in the solder resist layer by laser.

As laser in use for drilling the openings at this time, carbon dioxide gas laser, excimer laser, YAG laser and the like may be used. To provide the solder pads with the openings by carbon dioxide gas laser, it is desirable that its pulse energy is 0.5 to 100 mJ, the pulse width is 1 to 100 μs, the pulse interval is 0.5 ms or more and the frequency is 1000 to 6000 Hz. Further, the via hole may be formed by abrasion. After the openings are made with laser beam, it is permissible to carry out a desmear treatment by physical treatment such as chemical treatment with acid or oxidizing agent, plasma treatment, corona treatment with oxygen, nitrogen or the like.

After that, by hardening at 100 to 200° C. for at least 30 minutes, the solder resist layer is hardened completely. The solder pad of this case includes not only a conductive circuit but also a dummy conductive layer not connected electrically, an alignment mark and a conductive layer formed for recognizing a product.

As a result, a printed wiring board having solder resist with openings for the solder pads on the conductive circuit and conductive layer can be obtained.

(c) The process for forming the mask layer for covering the solder pads on the solder resist layer on which the solder pads are formed will be described. The mask layer is formed on a printed wiring board in which the solder pads are formed in the solder resist layer.

The mask layer is formed by applying resin whose viscosity is adjusted preliminarily or bonding dry-film like film or pressing that film by heat. The thickness of the mask layer is 5 to 30 μm. As the mask, heat hardening resin, thermoplastic resin, photopolymerizing polymer, resin produced by converting part of heat hardening resin to (meta) acrylic and compound of these resins are used, and of them, it is desirable to use epoxy resin, polyimide resin, phenol resin, polyolefin resin, phenoxy resin and the like. If it is needed, formed mask layer may be dried at 80 to 100° C. As a consequence, the mask layer may be turned to semi-hardened (B stage) state. A film processed in this B-stage may be bonded. Depending on the case, this may be done by exposure to draw directly.

After that, with a mask on which a non-formation region of the solder pads is drawn placed on the mask layer, ultraviolet ray is irradiated and openings of the non-formation region of the corrosion resistant layer are made by development with chemical such as alkali solution or by irradiation with laser beam. As a result, a mask non-formation portion and a mask formation portion are formed.

As laser in use for providing the mask layer with openings at this time, carbon dioxide gas laser, excimer laser, YAG laser and the like may be used. To provide the mask layer with the openings using carbon dioxide gas laser, it is desirable that its pulse energy is 0.5 to 100 ml, the pulse width is 1 to 100 µs, the pulse interval is 0.5 ms or more and the frequency is 1000 to 6000 Hz. Further, the via hole may be formed by abrasion. After the openings are made with laser beam, it is permissible to carry out desmear treatment by physical treatment such as chemical treatment with acid or oxidizing agent, plasma treatment, corona treatment with oxygen, nitrogen or the like. The corrosion resistant layer is formed on the solder pad in the mask layer non-formation region.

(d) The process of forming the corrosion resistant layer on the solder pad in the mask layer non-formation portion and process (e) of obtaining a plurality of solder pads including solder pads in which the corrosion resistant layer is formed and solder pads in which no corrosion resistant layer is formed mixedly by peeling the mask resist layer will be described.

The corrosion resistant layer is formed in the mask layer non-formation portion of the solder resist layer. In this case, the corrosion resistant layer refers to a layer composed of one or more layers with one or more metals selected from gold, silver, platinum, and noble metal. More specifically, nickel-gold, nickel-silver, nickel-platinum, gold (single layer), silver (single layer), nickel-palladium-gold, nickel-palladium-silver and the like can be mentioned.

These corrosion resistant layers may be formed by plating (electrolytic plating, electroless plating, displacement plating.) Alternatively, it may be formed by vapor deposition like sputtering. The corrosion resistant layer may be formed of a single layer or two or more layers.

Consequently, the corrosion resistant layer is formed on the solder pad corresponding to the mask layer non-formation portion. After that, a printed wiring board including the corrosion resistant layer formation solder pads in which the corrosion resistant layer is formed and the corrosion resistant layer non-formation solder pads in which no corrosion resistant layer is formed mixedly can be obtained by peeling the mask layer with alikali solution and likes.

It is desirable to provide an organic solderability preservative (OSP) (pre-flux) layer on the solder pad in which no corrosion resistant layer is formed by printing or spraying and likes. As a consequence, oxidation of the conductive circuit and the conductive layer can be inhibited until the solder is installed. Then, when the solder is installed, the OSP layer is removed not to hamper electric connectivity.

After that, by disposing solders of Sn—Pb, Sn—Ag—Cu or the like on each pad by printing, a printed wiring board in which solder layer is formed in the form of pads, constituted of conductive circuits (including lands) is obtained. Electronic components such as MPU, capacitor and resistor, display devices such as the liquid crystal display and the digital display, the operation device such as the key pad, the switch and the external terminals of USB, the ear phone and other external terminal are mounted on this board.

More desirably, the solder pad in which no corrosion resistant layer is formed is used as an electronic component mounting terminal and the solder pad in which the corrosion resistant layer is formed is used for an external terminal.

With this structure, reliability is more unlikely to drop as compared to a conventional multilayer printed wiring board in which the corrosion resistant layer is formed on all conductive portions exposed on the front face.

Particularly, as evident from evaluation of electric connectivity and reliability upon drop test, the degree of deterioration can be reduced as compared to the conventional printed wiring board and as a consequence, reliability for a long term is easy to maintain thereby the reliability is unlikely to drop.

Hereinafter an example of the manufacturing method of the multilayer printed wiring board of the present invention will be described with reference to the accompanying drawings.

(1) For manufacturing the multilayer printed wiring board of the present invention, as a circuit board serving as a basic unit constituting it, an insulation base material 30 whose one face or both faces are equipped with copper foil 32 is used as its starting material (FIG. 1(A)).

Although as this insulation base material for example, hard lamination base material selected from glass fabric epoxy resin base material, glass fabric bismaleimide triazine base material, glass fabric polyphenylene ether resin base material, aramide nonwoven fabric-epoxy resin base material, aramide unwoven-polyimde resin base material may be used, the glass fabric epoxy resin base material is the most desirable.

Preferably the thickness of the insulation base material is 20-600 µm. The reason is that if the thickness is less than 20 µm, its strength drops so that it is difficult to handle and at the same time, reliability to the electric insulation property drops, so that formation of the via hole may be difficult. Conversely, if the thickness is over 600 µm, formation of a fine via hole or depending on a case, filling with conductive paste is difficult and at the same time, the board itself turns thick.

Preferably, the thickness of the copper foil is 5-18 µm. To form the via holes in a circuit board with laser beam, a direct laser method of making the via hole in the copper foil and the insulation base material at the same time and the conformal method of removing a portion corresponding to the via hole in the copper foil by etching are available and any one may be used.

If the thickness of the copper foil is less than 5 µm, an end face of the via hole in the copper foil can be deformed when an opening for formation of the via hole is formed in the insulation base material by using a laser processing described later, so that a conductive circuit is difficult to form. If the thickness of the copper foil is over 18 µm, a conductive circuit pattern of fine lines is difficult to form by etching.

The copper foil 32 may be adjusted in thickness by half etching (FIG. 1(B)). In this case, as the copper foil 32, the one having a thickness larger than the above mentioned value (5 to 18 µm) is used. After half etching, the thickness of the copper foil is adjusted to 5 to 18 µm. In case of double sided copper clad lamination, the thicknesses of both faces are permitted to be different if the thicknesses of the copper foil are in the above-mentioned range. As a consequence, the strength can be intensified thereby executing following steps smoothly.

If the conductive circuit is formed on a single face by etching, it is easy to form.

As the insulation base material and the copper foil, preferably, a single sided or double sided copper clad lamination obtained by overlaying prepreg as B-stage produced by impregnating glass fabric with epoxy resin and copper foil and pressing them with heat is used. The reason is that the position of wiring pattern or via hole is not deflected during handling after the copper foil is etched and its positional accuracy is excellent.

(2) Next, an opening 34 is formed so that it reaches from the front face of the insulation base material 30 to the copper foil (or conductive circuit pattern) 32 on the rear face by irradiating the front face of the insulation base material 30 with the copper foil 32 with carbon dioxide gas laser (FIG. 1(C).

This laser processing is carried out with a pulse oscillation type carbon dioxide gas laser processing unit and preferably, its processing condition is that pulse energy is 0.5 to 100 mJ, pulse width is 1 to 100 pulse interval is 0.5 ms or more and the quantity of shots is in a range of 1 to 50.

The diameter of a via formation opening 34 which can be formed under such condition is preferred to be 50 to 250 µm.

(3) A desmear treatment is carried out to remove residual resin left on a side face and bottom of an opening formed in the step (2).

This desmear treatment is carried out according to wet processing such as chemical treatment with acid or oxidizing agent (for example, chromic acid, permanganic acid), or dry processing such as an oxide-plasma discharge treatment, a corona discharge treatment, an ultraviolet laser treatment and an excimer laser treatment. Such a desmear treatment is selected corresponding to the quantity of smear estimated to be left depending on the type and thickness of insulation base material, the diameter of opening for the via hole, laser condition and the like.

(4) Electrolytic copper plating treatment, the copper foil 32 as lead plating, is carried out to the copper foil face of a board undergoing the desmear treatment to fill the openings with electrolytic copper plating 36 thereby producing via holes 46 filled like a field. (FIG. 1 (D))

Depending on a case, electrolytic copper plating swollen on the top of the via hole opening on the board may be flattened by removing by belt sander polishing, buffing, etching or the like after the electrolytic copper plating treatment is finished.

Further, electrolytic plating may be formed through electroless plating. In this case, as electroless plating film, copper, nickel, silver or the like may be used.

(5) A resist layer 38 is formed on the electrolytic copper plating 36 (FIG. 2(A)). This resist layer may be formed by coating or bonding film-like material. An etching resist layer is formed by exposure/development with a mask on which a circuit is drawn preliminary placed on this resist film and a metallic layer of an etching resist non-formation portion is etched to form conductive circuit patterns 44 and 42 including the conductive circuit and the land (FIG. 2(B)).

As this etching solution, preferably, at least an aqueous solution selected from sulfuric acid-hydrogen peroxide, persulfate, copper (II) chloride and ferric (II) chloride is used. As pre-treatment for forming a conductive circuit by etching the copper foil, the thickness of the copper foil may be adjusted by etching the entire surface thereof to facilitate formation of a fine pattern. Although the inside diameter of the land as part of the conductive circuit is substantially the same as the diameter of the via hole, preferably, the outside diameter is in a range of 50 to 250 µm.

The single sided circuit board 30 manufactured through the steps (1) to (5) is a unit of circuit board having the copper foil as a conductive layer on one surface of the insulation base material and filled via holes in openings reaching from the other face to the copper foil. A multilayer circuit board is formed by overlaying a plurality of the circuit boards. Upon this overlaying, the multilayer circuit board may be formed by pressing all overlaid circuit boards collectively with heat. Alternatively, the multilayer circuit board may be formed by overlaying at least one circuit board successively into a multilayer structure. As the circuit board, the double sided circuit board may be used or the single sided circuit board may be used or both of them may be used mixedly.

(6) A plurality of the circuit boards is overlaid (FIG. 3(A)) and pressed with heat under a condition that heating temperature is 150 to 250° C. and pressure is 1 to 10 MPa to integrate into a multilayer structure (FIG. 3(B)). Preferably, this hot press is carried out under a reduced pressure. As a consequence, adhesion of the boards is obtained.

Further by etching the copper foil of a single sided circuit board of the topmost layer of the circuit boards integrated in the (6) and the copper foil of a single sided circuit board on the outermost side, conductive circuits (including via holes land) may be formed. In this etching process, after photosensitive dry film resist is bonded to the surface of the overlaid and pressed copper foil, the conductive circuits including the via hole land are formed by forming etching resist through exposure and development according to a predetermined circuit pattern and then etching the metallic layer of an etching resist non-formation portion.

(7) Next, a solder resist layer 90 is formed each on the surface of a circuit board on the outermost side (FIG. 4(A)). In this case, solder resist compound is applied to the entire outside surface of the circuit board and its coating film is dried. Then, this film is exposed to light and developed with a photo mask film on which openings for the solder pads are drawn placed on this coating film, so that conductive pad portions located just above the via holes of the conductive circuit are exposed outside to form a solder pad openings 90a. In this case, the openings may be formed by bonding a dry-film like solder resist layer and exposing/developing or using laser.

(8) A mask layer 50a is formed by coating or bonding a film on a board in which solder pads are opened in the solder resist layer 90. Then, a non-formation portion of the mask layer 50 is formed by exposure and development with an exposure mask 50 on which a formation portion 52a of the mask layer is drawn placed on the mask layer 50a (FIG. 4(C)). As a consequence, the solder pads 60B formed on the solder resist layer 60 are covered with the mask layer 50.

The corrosion resistant layer is formed nickel 54-gold 56 on the solder pads 60A exposed from the non-formation portion of the mask layer 20 (FIGS. 5(A) and (B1)). At this time, the thickness of the nickel layer 54 is desired to be 1 to 7 µm and the thickness of the gold layer 56 is desired to be 0.01 to 0.1 µm. Additionally, it is permissible to form the corrosion resistant layer of nickel-palladium-gold, gold (single layer), silver (single layer) or the like.

After the corrosion resistant layer is formed, the mask layer 50 is broken away. As a consequence, the corrosion resistant layer formation solder pads 60A in which the corrosion resistant layer is formed and the corrosion resistant layer non-formation solder pads 60B in which no corrosion resistant layer is formed come to exist on the printed wiring board (FIG. 5(C)).

In case of a portable electronic appliance, the solder pads exposed from the solder resist layer, the portion in which the corrosion resistant layer is formed is used for mainly an external terminal and the corrosion resistant layer non-formation portion is used for mainly an electronic component mounting terminal.

In case of a package board, the solder pads exposed from the solder resist layer, the portion in which the corrosion resistant layer is formed is used for mainly the terminal of an IC chip mounted as a bare chip and the corrosion resistant layer non-formation portion is used for mainly the electronic componet mounting terminal or as the pad for the external terminal.

(9) By supplying a solder body to the solder pad portions exposed just above the via hole from an opening in the solder resist obtained in the (8), solder bumps 96U, 96D are formed by melting/solidification of this solder body (FIG. 6). Alternatively, by connecting a conductive ball or a conductive pin to the pad portion with a conductive adhesive agent or a solder layer, the multilayer circuit board is formed. Additionally, a capacitor, resistor or the like may be mounted on the formed solder layer. Further, an external terminal such as a key pad may be mounted on the solder layer.

As a supply method for the solder body and the solder layer, a solder transfer method or a print method may be used.

According to the solder transfer method, a solder foil is bonded to prepreg and this solder foil is etched leaving only portions corresponding to the opening portions to form a solder pattern as the solder carrier film. After flux is applied to the solder resist opening portion of the board, this solder carrier film is overlaid so that the solder pattern makes contact with the pads and transferred by heating.

On the other hand, according to the print method, a print mask (metal mask) provided with openings at portions corresponding to the pads is placed on a board and solder paste is printed and treated with heat. As solder for forming such a solder bump, Sn/Ag solder, Sn/In solder, Sn/Zn solder, Sn/Bi solder and the like may be used.

Consequently, a printed wiring board for a portable electronic appliance is obtained.

If a bare chip is mounted for the package board by flip chip bonding, the external terminals are disposed on a same plane as the IC chip or on a face on an opposite side to the IC chip.

If the IC chip, an electronic component and external terminals are provided on the package board by solder, the melting point of solder to be connected to the IC chip is desired to be equal to or lower than the melting point of the solder to be connected to the external terminal. As a consequence, connectivity between a connection terminal and board is obtained easily.

If the bare chip is mounted for the package board by wire bonding, the external terminals are disposed on a same plane as the IC chip or on a face on an opposite side to the IC chip.

In addition to the manufacturing method described above, the subtractive method, a semi additive method, a full additive method or a combination of these two or more methods can be applied for manufacturing the board. Although a board having the via holes (non through hole) is represented in the drawings, a board whose interlayer connection is achieved by through holes which go through all layers of the board may be used.

BRIEF DESCRIPTION OF THE DRAWINGS

FIG. 10 is a table showing an evaluation result of the example 1 and a comparative example 1;

FIG. 12(A1) is a plan view of a package board according to example 2-1-1 before an IC chip is mounted, FIG. 12(B1) is a rear view thereof, FIG. 12(A2) is a plan view of the package board after the IC chip is mounted and FIG. 12(B2) is a rear view thereof;

FIG. 13(A1) is a plan view of the package board according to example 2-2-1 before the IC chip is mounted, FIG. 13(B1) is a rear view thereof, FIG. 13(A2) is a plan view of the package board after the IC chip is mounted, and FIG. 13(B2) is a rear view thereof;

FIG. 14(A1) is a plan view of a package board according to example 2-3-1 before an IC chip is mounted, FIG. 14(B1) is a rear view thereof, FIG. 14(A2) is a plan view of the package board after the IC chip is mounted and FIG. 14(B2) is a rear view thereof;

FIG. 15(A1) is a plan view of a package board according to example 2-4-1 before an IC chip is mounted, FIG. 15(B1) is a rear view thereof, FIG. 15(A2) is a plan view of the package board after the IC chip is mounted and FIG. 15(B2) is a rear view thereof;

FIG. 16(A1) is a plan view of a package board according to example 2-5-1 before an IC chip is mounted, FIG. 16(B1) is a rear view thereof, FIG. 16(A2) is a plan view of the package board after the IC chip is mounted and FIG. 16(B2) is a rear view thereof;

FIG. 17(A1) is a plan view of a package board according to example 2-6-1 before an IC chip is mounted, FIG. 17(B1) is a rear view thereof, FIG. 17(A2) is a plan view of the package board after the IC chip is mounted and FIG. 17(B2) is a rear view thereof; and FIG. 18 is a table showing an evaluation result of the example 2 and comparative example 2.

DESCRIPTION OF THE PREFERRED EMBODIMENTS

First Embodiment

Example 1-1

Figure 1:
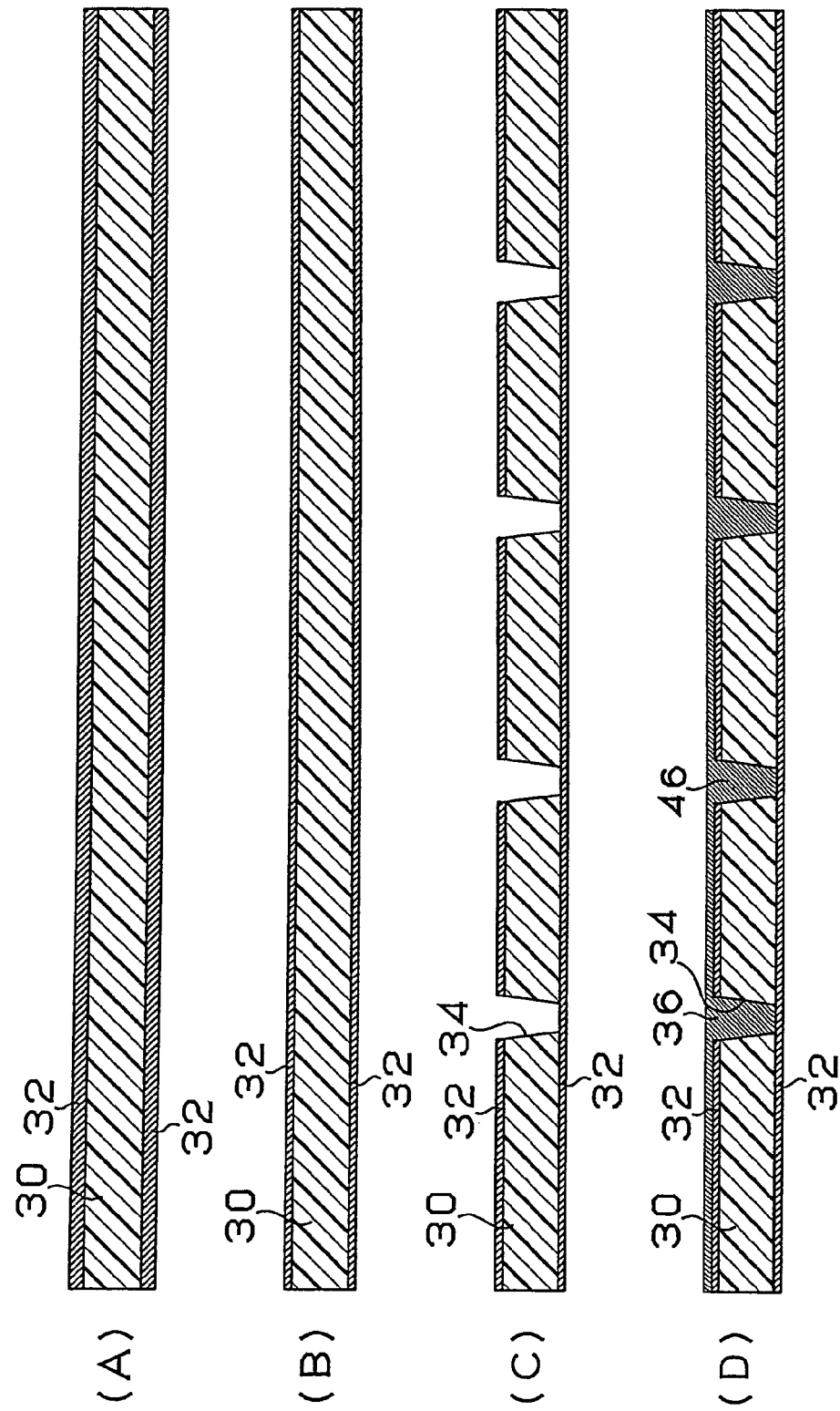
FIG. 1 is a process diagram showing a manufacturing method of a multilayer printed wiring board according to an example 1 of the present invention.

(1) First, a double sided circuit board intended to constitute a multilayer circuit board is manufactured. This circuit board utilizes a double sided copper-clad lamination obtained by overlaying prepreg 30 as B-stage created by impregnating glass fabric with expoxy resin and copper foil 32 and pressing with heat as a starting material (FIG. 1(A)).

The thickness of this insulation base material was 75 μm and the thickness of the copper foil was 12 μm. It is permissible to use a copper foil thicker than 12 μm as this layered board and then adjust the thickness of the copper foil to 12 μm by etching treatment (FIG. 1(B)).

(2) The copper foil 32 and the insulation base material 30 were drilled by irradiating the double sided circuit board having the copper foil 32 with carbon dioxide gas laser and a via hole formation opening 34 reaching the copper foil 32 on an opposite side was formed (FIG. 1(C)). Further, the desmear treatment was performed within the opening by chemical treatment with permanganic acid.

To form the opening for via hole formation in this example, HITACHI VIA ENGINEERING LTD. manufactured high peak short pulse oscillation type carbon dioxide gas laser processor machine was used. Then, openings 34 with 80 µm in diameter for via hole formation were formed in glass fabric epoxy resin base material whose base material was 75 µm thick at a speed of 100 holes/second by irradiating directory to the copper foil with laser beam.

(3) Electrolytic copper plating treatment with copper foil as plating lead was carried out under a following condition on the copper foil face after the via holes were drilled in the insulation base material subjected to the desmear treatment.
[Electrolytic plating solution]
Sulfuric acid: 2.24 mol/l
Copper sulfate: 0.26 mol/l
Additive A (reaction accelerator): 10.0 ml/l
Additive B (reaction inhibitor): 10.0 ml/l
[Electrolytic plating condition]
Current density: 1 A/dm$^2$
Time: 65 minutes
Temperature: 22±2° C.

Formation of electrolytic copper plating film within the via hole was accelerated by the additive A and conversely, the additive B adheres to mainly the copper foil portion so as to inhibit formation of the plating film. When the via hole is filled with the electrolytic copper plating so that the height thereof turns substantially equal to the height of the copper foil, the additive B adheres thereby inhibiting the formation of the plating film like the copper foil portion. As a consequence, the opening 34 was filled with an electrolytic copper plating 36 so as to form a via hole 46 in which its via hole portion and the copper foil were flattened to the same level (FIG. 1(D)).

The thickness may be adjusted by etching the conductive layer comprising the copper foil and the electrolytic plating film. Depending on a case, it is permissible to adjust the thickness of the conductive layer according to the physical method of sander belt polishing and buffing.

Figure 2:
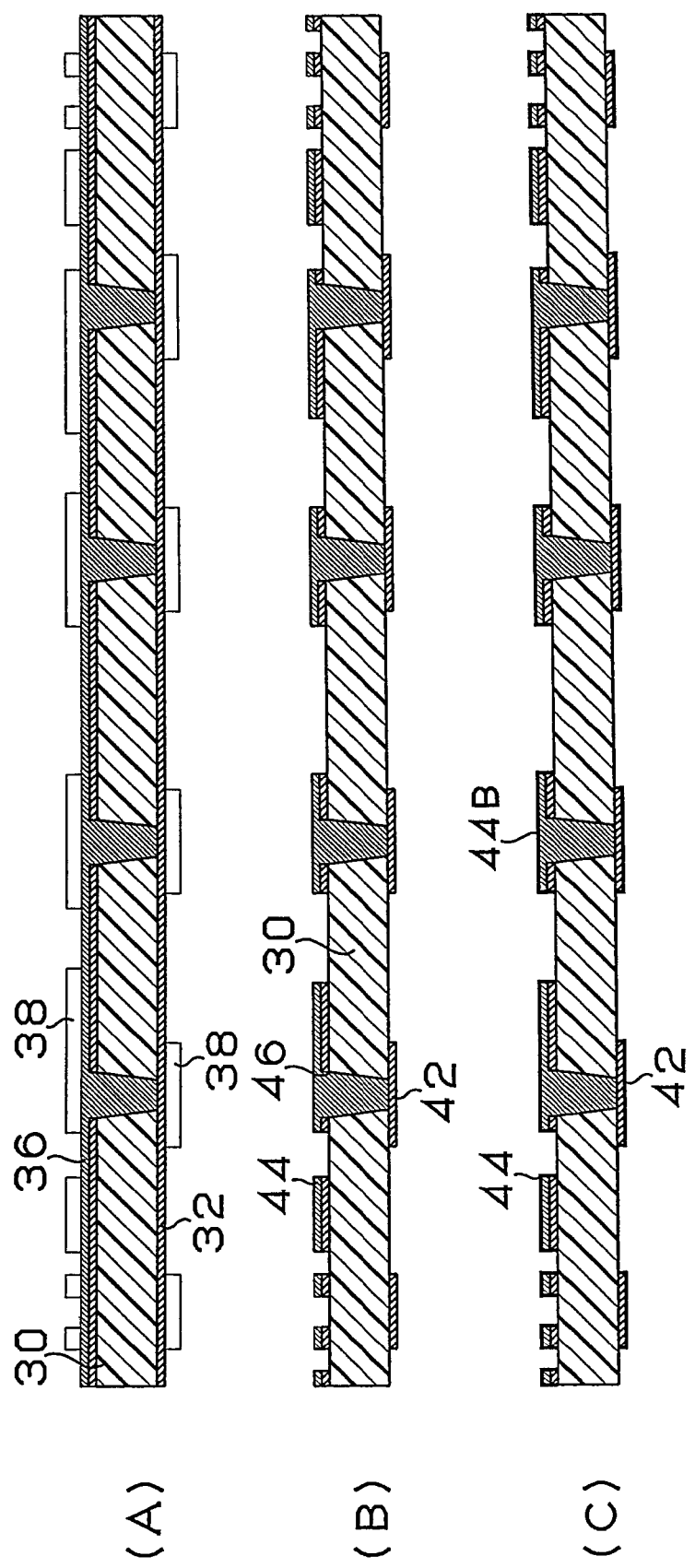
FIG. 2 is a process diagram showing the manufacturing method of the multilayer printed wiring board according to the example 1.

(4) Photosensitive dry film etching resist 38 was formed on the copper foil 32 and the copper plating 36 as the insulation base material passing the aforementioned process (3) (FIG. 2(A)). The resist 38 was formed in the thickness of 15 to 20 µm and resist non-formation portion was formed on the copper foil through the process of the conductive circuit, the land of the via hole and exposure/development. Then, the copper plating film and the copper foil corresponding to the non-formation portion are removed by etching the resist non-formation portion with etching solution composed of hydrogen peroxide solution/sulfuric acid.

(5) After that, the resist 38 is broken away with alkali solution so as to form conductive circuits 42 and 44 and a via hole 46 (FIG. 2(B)). As a consequence, a circuit board in which the via hole 46 for connecting the front and rear faces exists and that via hole and the copper foil portion serving as a conductive circuit are flattened to the same level is obtained. After that, it is permissible to provide a blackened layer 44B on the conductive circuits 42 and 44 by blackening (FIG. 2(C)).

Figure 3:
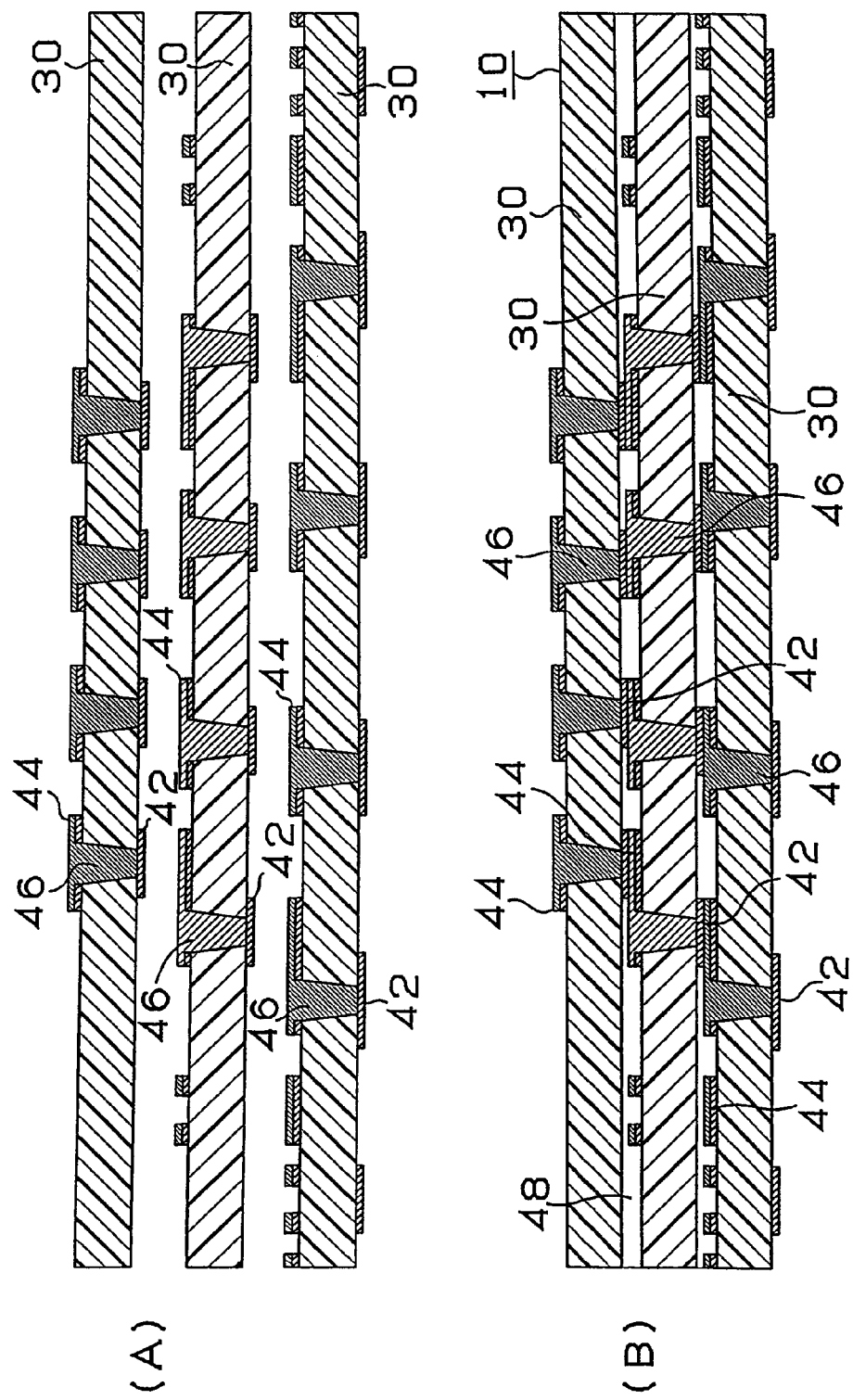
FIG. 3 is a process diagram showing the manufacturing method of the multilayer printed wiring board according to the example 1.

With the circuit board 30 obtained through the processes (1) to (5) as a unit (FIG. 3(A)), the boards 30 were overlaid with an adhesive material layer 48 like prepreg sandwiched therebetween and pressed with heat under a condition in which the temperature was 80 to 250° C. and the pressure was 1.0 to 5.0 kgf/cm$^2$ so as to form the multilayer wiring board 10 (FIG. 3(B)).

(10) The solder resist layer was formed on the surface of the circuit board located at the topmost layer and bottommost layer of the multilayer board 10. The solder resist layer was formed in the thickness of 20 to 30 µm by bonding a film solder resist layer or applying varnish whose viscosity was adjusted preliminarily.

Figure 4:
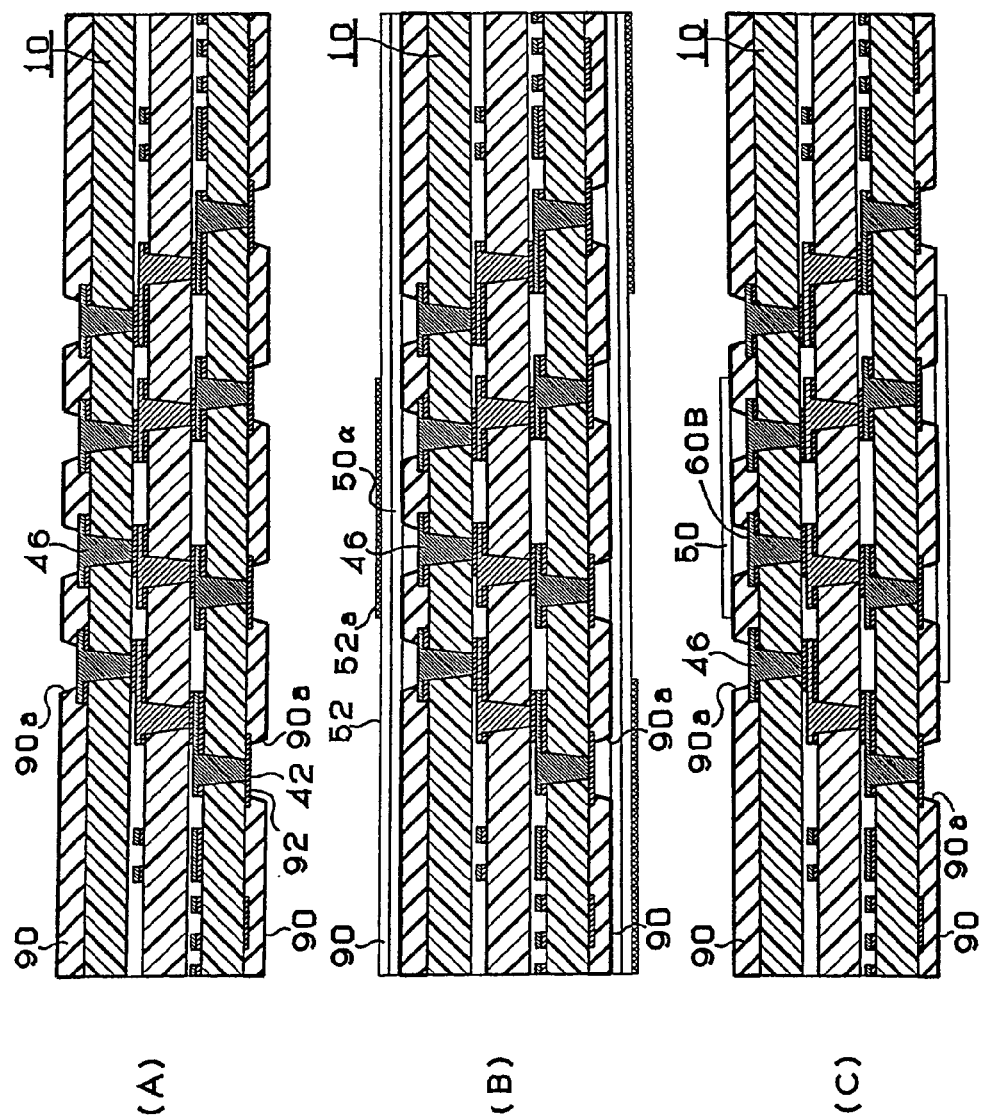
FIG. 4 is a process diagram showing the manufacturing method of the multilayer printed wiring board according to the example 1.
Figure 8:
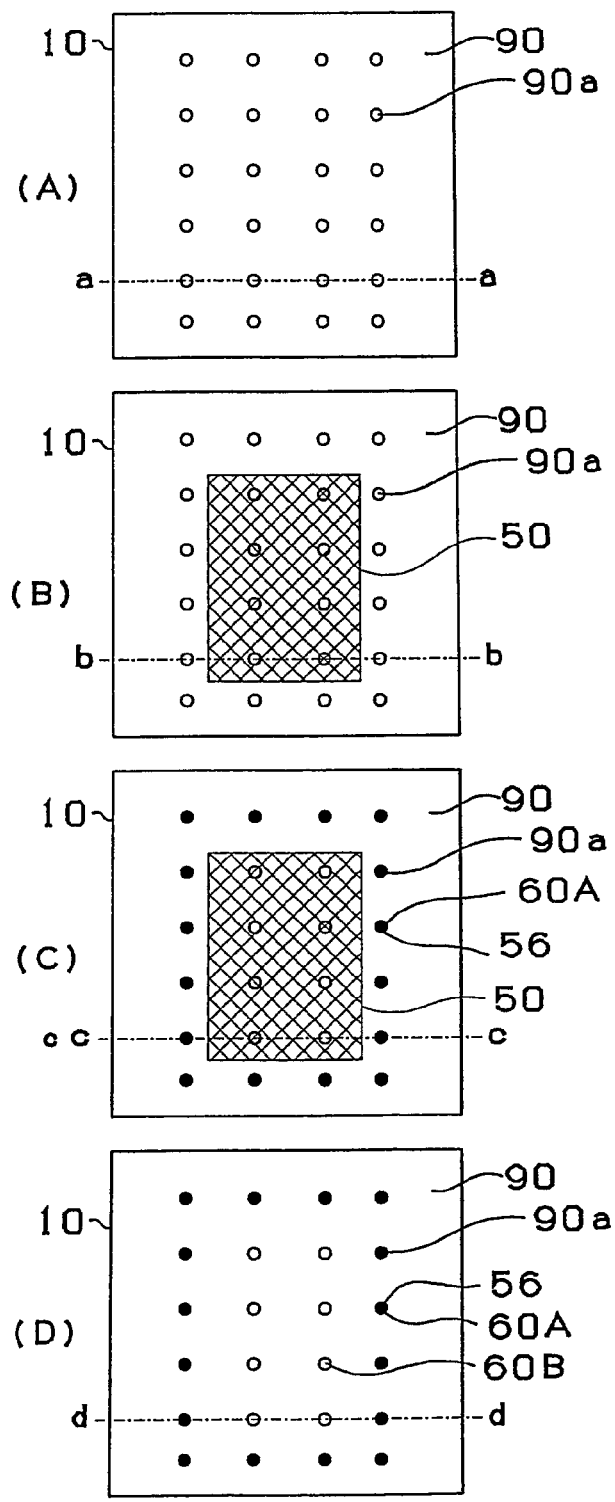
FIG. 8 is a plan view showing a manufacturing method of the multilayer printed wiring board according to the example 1.

Next, drying treatment was carried out at 70° C. for 20 minutes and 100° C. for 30 minutes and then, by using soda lime glass board of 5 mm in thick on which a circular pattern (mask pattern) was drawn with a chrome layer for a solder resist opening with a side on which the chrome layer was formed fitted to the solder resist layer, ultraviolet ray of 1000 mJ/cm$^2$ was irradiated and then DMTG development was executed. Further, this multilayer board 10 was heat treated at 120° C. for an hour and 150° C. for three hours so as to form the solder resist layer of 20 µm in thick having an opening 90a corresponding to a pad portion (diameter of the opening: 200 µm) (FIG. 4(A)). FIG. 8(A) shows a plan view of this multilayer printed wiring board 10. FIG. 4(A) corresponds to a section taken along the line a-a in FIG. 8(A).

Before the solder resist layer is formed, a roughened layer is provided on the surface of a circuit board located at the topmost layer and, if it is needed, the bottommost layer of the multilayer board.

(11) A dry film like mask layer is formed of photosensitive resin on the solder resist layer. The mask layer was formed in the thickness of 10 to 20 µm on the solder resist layer by bonding a film-like mask layer or applying varnish whose viscosity was adjusted preliminarily.

Next, drying treatment was carried out at 80° C. for 30 minutes and with a soda lime glass board 52 of 5 mm in thick on which a mask layer non-formation pattern (mask pattern) 52a was drawn fitted to the mask layer 50a, ultraviolet ray of 800 mJ/cm$^2$ was irradiated (FIG. 4(B)) and DMTG development was carried out. Further, this multilayer board was heat treated at 120° C. for an hour so as to form a mask layer formation portion whose solder pad 60B is covered in a region in which no corrosion resistant layer is formed, and a mask layer 50 (15 µm in thick) composed of a mask layer non-formation portion whose solder pad 60A is exposed in a region in which corrosion resistant layer is formed. FIG. 8(B) shows a plan view of this multilayer printed wiring board 10. A section taken along the line b-b in FIG. 8(B) corresponds to FIG. 4(C).

Figure 5:
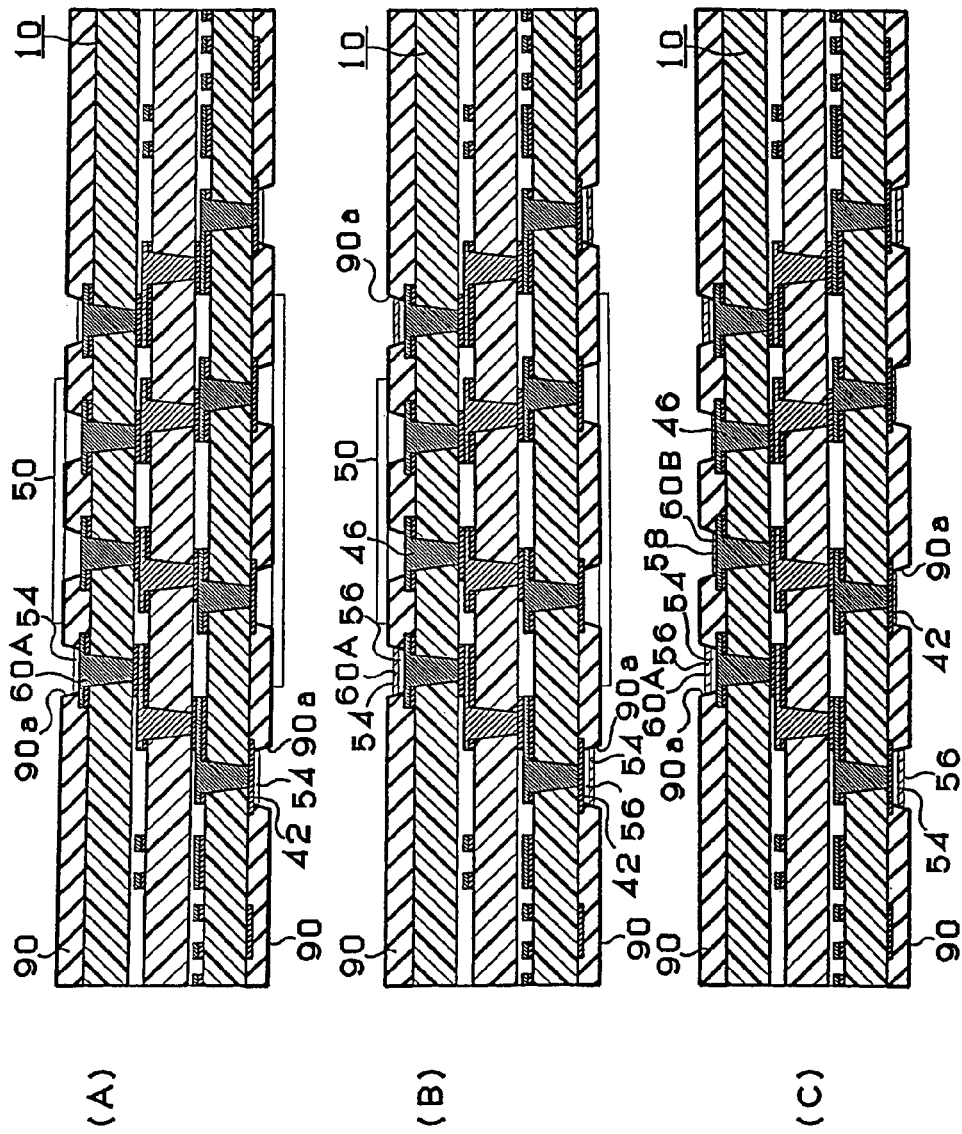
FIG. 5 is a process diagram showing the manufacturing method of the multilayer printed wiring board according to the example 1.

(12) Next, after the solder resist layer is formed, the board was dipped in electroless nickel plating solution having pH=5 composed of nickel sulfate of 6.0 g/l and sodium hypophosphite of 25 g/l for 40 minutes so as to form a nickel plating layer 54 of 4 µm in thick in the opening 90a (solder pad 60A) (FIG. 5(A)).

Further, the board was dipped in electroless gold plating solution composed of potassium gold cyanide of 1.5 g/l and citric acid of 80 g/l for 600 seconds so as to form a gold plating layer 56 of 0.05 µm in thick on the nickel plating layer 54 so that a corrosion resistant metallic layer was formed of the nickel plating layer 54 and the gold plating layer 56 (FIG. 5(B)). FIG. 8(C) shows a plan view of this multilayer printed wiring board 10. A section taken along the line c-c in FIG. 8(C) corresponds to FIG. 5(B).

As a consequence, the corrosion resistant layer was formed composed of nickel 54-gold 56 in the solder pad 60A corresponding to the non-formation portion of the mask layer 50. After that, by peeling the mask layer 50 with alkali solution and the like, a multilayer printed wiring board 10, in which the corrosion resistant layer formation solder pad 60A including a corrosion resistant layer and the corrosion resistant non-formation solder pad 60B including no corrosion resistant layer coexist, was obtained. An OPS layer 58 was formed in the corrosion resistant non-formation solder pad 60B (FIG. 5(C)). FIG. 8(D) shows a plan view of this multilayer printed wiring board 10. A section taken along the line d-d in FIG. 8(D) corresponds to FIG. 5(C).

Figure 6:
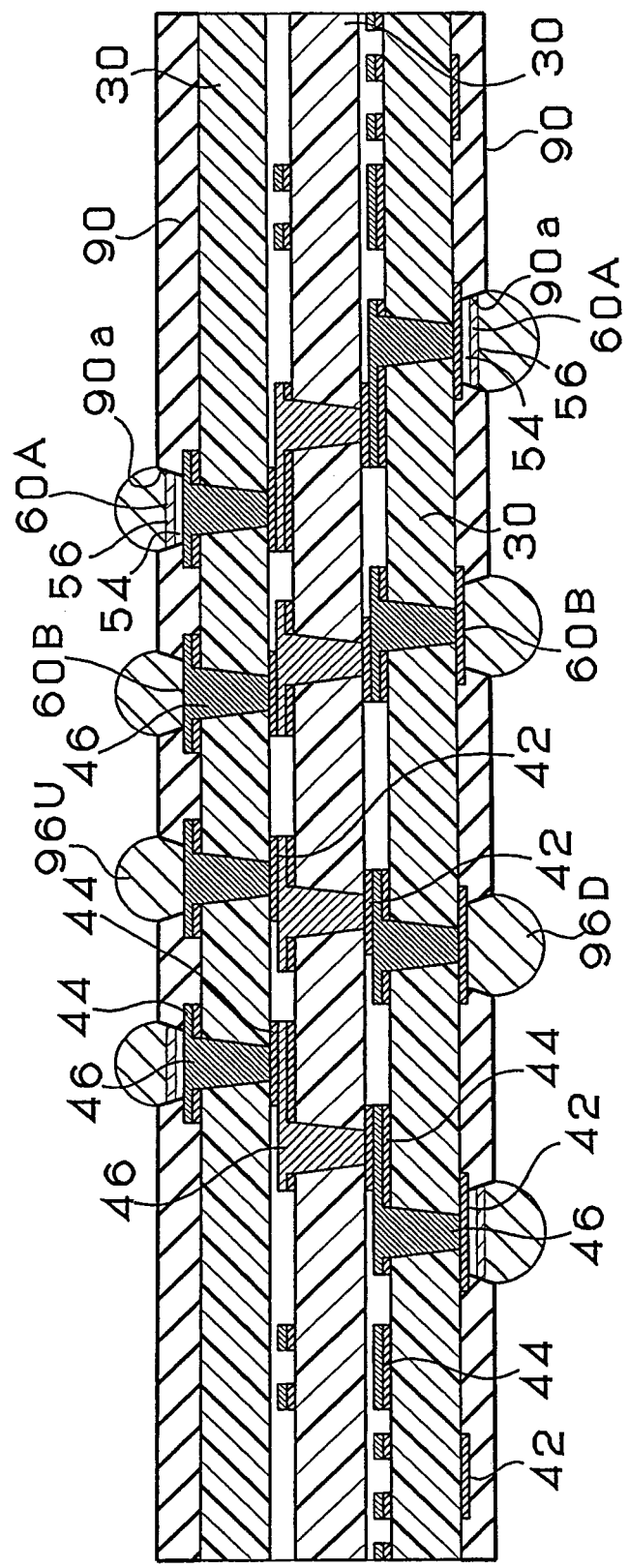
FIG. 6 is a sectional view of the multilayer printed wiring board according to the example 1.

(13) Then, solder paste composed of Sn/Pb solder whose melting point T2 was about 183° C. was printed to the solder pads 60A and 60B exposed through an opening in the solder resist layer covering the multilayer circuit board on the topmost layer and reflowed at 183° C., so as to form solder layers 96U and 96D (FIG. 6).

Figure 7:
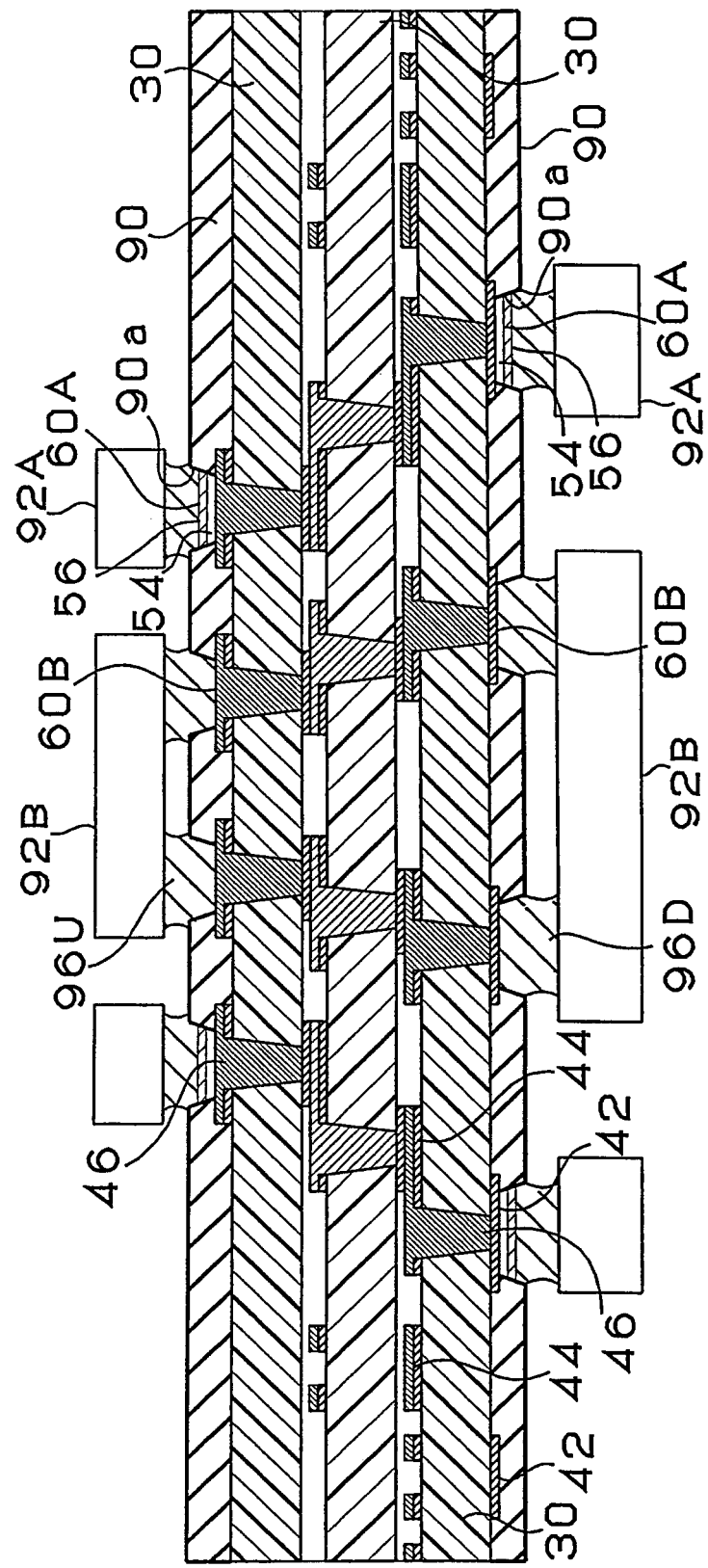
FIG. 7 is a sectional view of the multilayer printed wiring board of FIG. 6 indicating a condition in which components are mounted.

An electronic component 82B, mainly a capacitor and a resistor is mounted on the solder layers 96U and 96D on the corrosion resistant non-formation solder pad 60B in which no corrosion resistant layer is formed and an external terminal 92A, mainly, a key pad is mounted in a region in which the solder layers 96U and 96D are formed on the corrosion resistant formation solder pad 60A (FIG. 7).

Figure 9:
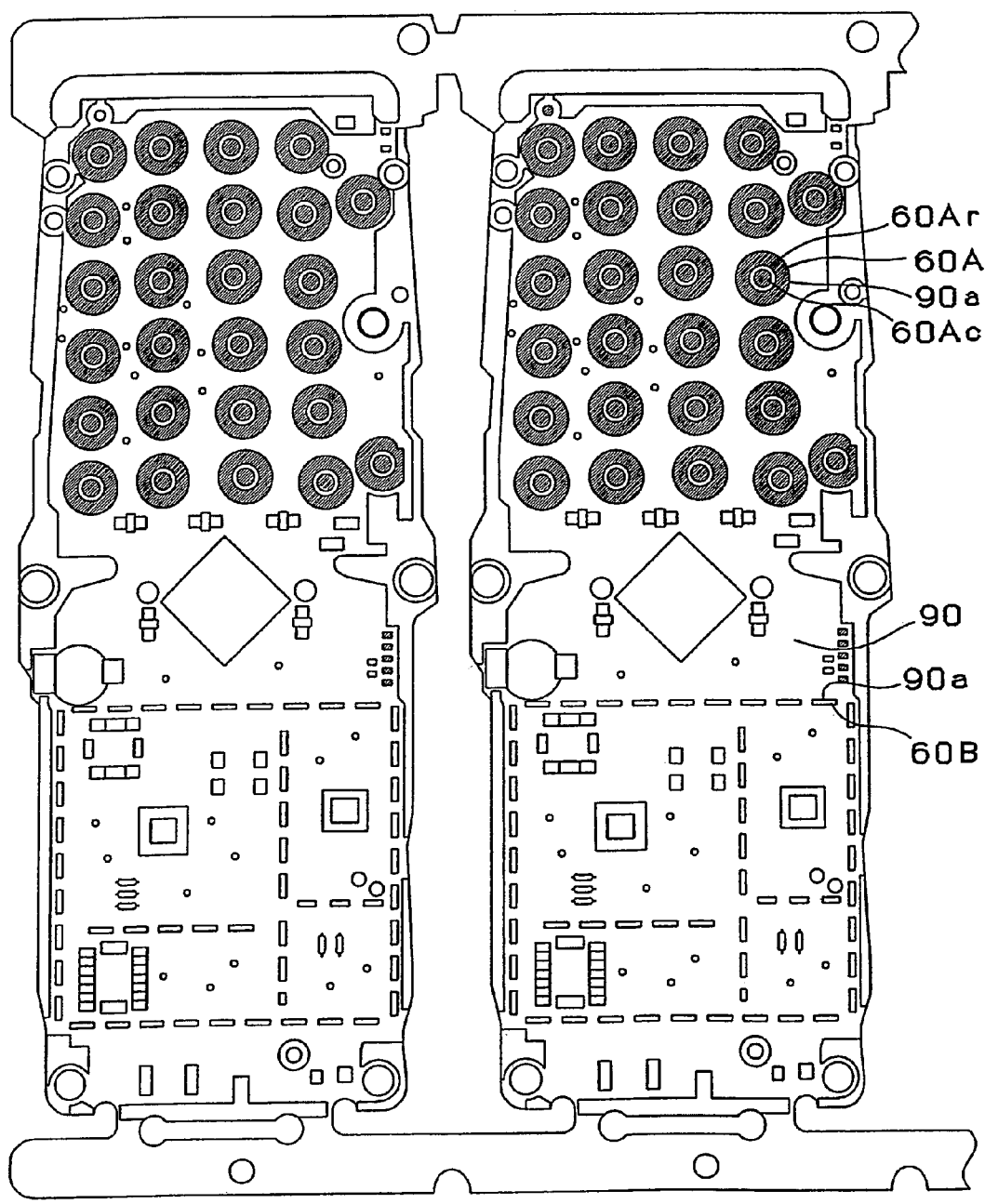
FIG. 9 is a plan view of the printed wiring board applied to a portable telephone of the example 1.

FIG. 9 is a plan view of a multilayer printed wiring board for a portable telephone manufactured according to the manufacturing method of the example 1.

The solder pad 60B on which a component is to be mounted via solder and the land 60A, which corrosion resistant layer is formed of nickel layer-gold layer, constituting the terminal of a key pad, are provided on the opening 90a of the solder-resist layer 90 of the multilayer printed wiring board. The land 60A is comprised of a central portion 60Ac and a ring portion 60Ar located around it. A carbon pillar (conductive member) held by a holding member having plasticity is disposed above the land 60A and when a key is operated, the carbon pillar connects electrically the central portion 60Ac with the ring portion 60Ar.

Example 1-2

This example is the same as the example 1-1 except that no OPS layer was formed on a solder pad in which the corrosion resistant layer of the example 1-1 is not formed.

Example 1-3

This example is the same as the example 1-1 except that corrosion resistant layer of nickel-palladium-gold was formed on the solder pad in which the corrosion resistant layer of the example 1-1 was formed.

Example 1-4

This example is the same as the example 1-1 except that corrosion resistant layer was formed of single layer gold on the solder pad in which the corrosion resistant layer of the example 1-1 was formed.

Comparative Example 1-1

In the comparative example 1-1, the corrosion resistant layer (nickel-gold) was formed on all solder pads. Other matters are the same as the example 1-1.

In a group of the example 1 and the comparative example 1, manufactured printed wiring boards were evaluated according to an item A and after the manufactured printed wiring board was accommodated into a casing, evaluation on items B and C was performed. This evaluation result is indicated in FIG. 10.

1-A. Reliability Test

Under the heat cycle condition (130° C./3 min and 55° C./3 min as a cycle), this cycle test was repeated up to 5,000 cycles and every other 500 cycles, a test piece was left for 2 hours after the test ended and a continuity test was carried out. The number of cycles up to when circuits whose resistance change ratio exceeded ±10% exceeded 50% measured circuits were compared.

1-B. Startup Test

As for a casing equipped with power supply, whether or not the test piece was started up smoothly when it was powered was judged.
Started within two seconds after the power was turned on: ○
Started within 10 seconds after the power was turned on: Δ
Did not start: X 1-C. Drop Test A test piece was dropped naturally from a base fixed at a height of 1 m with its liquid crystal portion facing downward. This test was executed once, three times and five times and each time, startup test of B was carried out.

Second Embodiment

In the first embodiment described above with reference to FIGS. 1-10, an example that the multilayer printed wiring board of the present invention was applied to the multilayer printed wiring board of a portable phone has been picked up. Contrary to this, according to the second embodiment, the printed wiring board of the present invention is applied to a package board loaded with an IC chip.

Example 2-1-1

Figure 11:
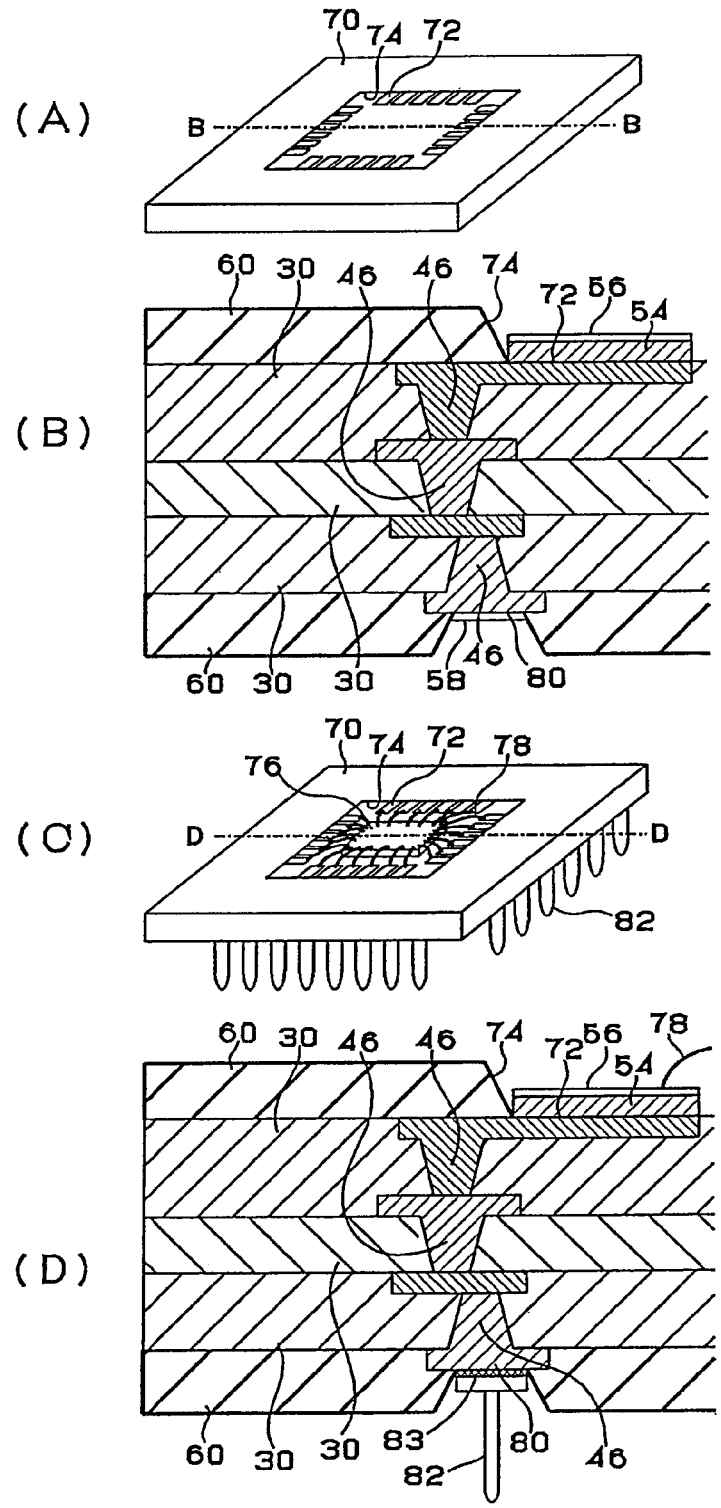
FIG. 11(A) is a perspective view of a package board according to example 2-1-1 before an IC chip is mounted.
FIG. 11(B) is a sectional view taken along the line B-B of FIG. 11(A)
FIG. 11(C) is a perspective view of a package board after the IC chip is mounted and FIG. 11(D) is a sectional view taken along the line D-D of FIG. 11(C)

Although the manufacturing process is the same as the example 1-1, the example 2-1-1 is used as a package board. FIG. 11(A) shows a perspective view of a package board 70 before the IC chip is mounted. FIG. 11(B) shows a sectional view taken along the line B-B of FIG. 11(A). FIG. 11(C) shows a perspective view of the package board after the IC chip is mounted. FIG. 11(D) shows a sectional view taken along the line D-D of FIG. 11(C). FIG. 12(A1) shows a plan view of the package board 70 before the IC chip is mounted. FIG. 12(B1) shows a rear view and FIG. 12(A2) shows a plan view of the package board 70 after the IC chip is mounted. FIG. 12(B2) shows a rear view.

As shown in FIGS. 11(A) and 12(A1), a cavity 74 is provided in the face of the package board 70 and a bonding pads 72 extend in the cavity 74. As shown in FIG. 11(B), the package board 70 is produced by overlaying the boards 30 each in which the via holes 46 are formed. The corrosion resistant layer composed of the nickel layer 54 and the gold layer 56 are formed on the bonding pads 72 on the front face. The OPS layer 58 is provided on a pad 80 on the rear face. As shown in FIGS. 11(C) and 12(A2), an IC chip 76 is incorporated in the cavity 74 and the IC chip 76 and the bonding pad 72 are connected with wire (gold wire) 78. As shown in FIG. 11(D) and FIG. 12(B2), a connecting pins 82 are attached to a bump (corrosion resistant non-formation) 80, which is an external terminal on the rear face, via solder 83.

Example 2-1-2

Although like the example 2-1-1, the wire bonding pads (corrosion resistant layer formed) 72 are formed on the front face and the connection pin pad (corrosion resistant layer not formed) 80, which is an external terminal, is disposed on the rear face, no OSP layer is formed on the pad 80.

Example 2-1-3

Although like the example 2-1-1, the wire bonding pads (corrosion resistant layer formed) 72 are formed on the front face, the connection pin pads (corrosion resistant layer not formed) 80, which are external terminals, are disposed on the rear face and the OSP layer is formed on the pad 80, nickel-gold or nickel-palladium-gold is formed on the bonding pad (corrosion resistant layer) 72.

Example 2-2-1

Like the example 2-1-1, as shown in FIG. 13(A1), the wire bonding pads (corrosion resistant layer formed) 72 and electronic component mounting pads (corrosion resistant layer not formed) 86 are provided on the front face, the connection pin pads (corrosion resistant layer not formed) 80, which are an external terminal, are formed on the rear face and the OSP layer is formed on the electronic component mounting pad 86 and the connection pin pad 80. As shown in FIG. 13(A2), an electronic component (chip capacitor) 90 is mounted on the electronic component mounting pad 86 on the front face and the connecting pin 82 is attached to the pad 80 on the rear face.

Example 2-3-1

Like the example 2-1-1, as shown in FIG. 14(A1), the wire bonding pads (corrosion resistant layer formed) 72 and the connection pin pads (corrosion resistant layer not formed) 80 are disposed on the front face and the OSP layer is formed on the connecting pin pad 80. As shown in FIG. 14(A1), the IC chip 76 is mounted on the front face and the connecting pin 82 is attached to the pad 80.

Example 2-4-1

Like the example 2-1-1, as shown in FIG. 15(A1), the flip chip bonding pads (corrosion resistant layer formed) 88 are formed on the front face and as shown in FIG. 15(B1), BGA pads (corrosion resistant layer not formed) 80, which are an external terminal, are disposed on the rear face and the OSP layer is formed on the BGA pad 80. As shown in FIG. 15(A2), the IC chip 76 is mounted on the front face via the flip chip bonding pad 88 and as shown in FIG. 15(B2), BGAs 84 are formed on the BGA pads 80.

Example 2-4-2

Although like the example 2-4-1, the flip chip bonding pads (corrosion resistant layer formed) 88 are formed on the front face and the BGA pads (corrosion resistant layer not formed) 80, which are an external terminal, are disposed on the rear face and the OSP layer is formed on the pad 80.

Example 2-4-3

Although like the example 2-1-1, the flip chip bonding pads (corrosion resistant layer formed) 88 are formed on the front face and the BGA pads (corrosion resistant layer not formed) 80, which are an external terminal, are disposed on the rear face and the OSP layer is formed on the pad 80, nickel-gold or nickel-palladium-gold is formed on the flip chip bonding pad (corrosion resistant layer formed) 88.

Example 2-5-1

Like the example 2-1-1, as shown in FIG. 15(A1), the flip chip bonding pads (corrosion resistant layer formed) 88 and the electronic component mounting pads (corrosion resistant layer not formed) 86 are provided on the front face and the BGA pads (corrosion resistant layer formed) 80 are disposed on the rear face and the OSP layer is formed on the electronic component mounting pads 86 and the BGA pads (corrosion resistant layer not formed) 80. As shown in FIG. 15(A2), an electronic component (chip capacitor) 90 is mounted on the electronic component mounting pad 86 on the front face and the BGA 84 is formed on the BGA pad 80 on the rear face.

Example 2-6-1

Like the example 2-1-1, as shown in FIG. 17(A1), the flip chip bonding pads (corrosion resistant layer formed) 88 and the BGA pads (corrosion resistant layer not formed) 80 are disposed on the front face and the OSP layer is formed on the BGA pad (corrosion resistant layer not formed) 80. As shown in FIG. 17(A1), the IC chip 76 is mounted on the front face and the BGA 84 is formed on the BGA pad 80 of the front face.

Comparative Example 2-1

According to the comparative example 2-1, the corrosion resistant layer (nickel-gold) was formed on all the pads 80. Other matters were set equal to the example 2-1-1.

Comparative Example 2-2

According to the comparative example 2-2, the corrosion resistant layer (nickel-gold) was formed on all the pads 80. Other matters were set equal to the example 2-4-1.

In a group of the example 2 and the comparative example 2, manufactured printed wiring boards were evaluated according to an item 2-A and printed wiring boards mounted with the IC chip were evaluated according to items 2-B and 2-C.

2-A. Reliability Test

Under the heat cycle condition (130° C./3 min and 55° C./3 min as a cycle), this cycle test was repeated up to 5,000 cycles and every other 500 cycles, a test piece was left for 2 hours after the test ended and the continuity test was carried out to verify whether or not continuity was obtained. Then, the number of cycles in which no continuity was verified were compared.

2-B. Continuity Test after Mounting

After a bare chip was mounted and an external terminal was disposed, the continuity test was carried out at 20 places at random and whether or there was any terminal whose resistance change ratio exceeded ±10% was verified. A test piece whose resistance change ratio exceeded ±10% was cut near its external connecting terminal to obtain a cross section and by observing a given pad with a microscope (×200), whether or not any crack existed on its conductive circuit or solder layer was verified.

2-C. Reliability Test after Mounting a Bare Chip

Under the heat cycle condition (130° C./3 min and 55° C./3 min as a cycle), this cycle test was repeated up to 5,000 cycles and every other 500 cycles, a test piece was left for 2 hours after the test ended and the continuity test was carried out at 10 places. Whether or not five or more circuits whose resistance change ratio exceeded ±10% existed was verified and the number of cycles in which there existed five or more such circuits was compared.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A printed wiring board, comprising:
an insulating base;
a first conductive circuit formed on a first surface of the insulating base;
a second conductive circuit formed on a second surface of the insulating base on an opposite side with respect to the first surface of the insulating base;
a first solder-resist layer covering the first conductive circuit and having a plurality of openings exposing a plurality of portions of the first conductive circuit such that the plurality of openings of the first solder-resist layer forms a plurality of first solder pads, respectively; and
a second solder-resist layer covering the second conductive circuit and having a plurality of openings exposing a plurality of portions of the second conductive circuit such that the plurality of openings of the second solder-resist layer forms a plurality of second solder pads, respectively,
wherein the plurality of first solder pads includes a plurality of pads having a plurality of surface portions, respectively, and the plurality of second solder pads includes a plurality of pads having a plurality of surface portions different from the surface portions of the plurality of pads in the plurality of first solder pads, respectively, and
wherein the plurality of openings in the first solder-resist layer exposes the plurality of portions of the first conductive circuit such that the first solder-resist layer overlaps peripheral portions of the first solder pads, respectively, the plurality of openings in the second solder-resist layer exposes the plurality of portions of the second conductive circuit such that the second solder-resist layer overlaps peripheral portions of the second solder pads, respectively, the plurality of pads in the plurality of first solder pads is a plurality of corrosion resistant layer formation pads each having a corrosion resistant layer formed on one of the portions of the first conductive circuit with respect to the corrosion resistant layer formation pads, and the plurality of pads in the plurality of second solder pads is a plurality of corrosion resistant layer non-formation pads each not having a corrosion resistant layer on one of the portions of the second conductive circuit with respect to the corrosion resistant layer non-formation pads.

2. The printed wiring board according to claim 1, wherein the plurality of corrosion resistant layer formation solder pads forms a plurality of external terminals.

3. The printed wiring board according to claim 1, wherein the plurality of corrosion resistant layer formation solder pads forms a plurality of pads on which a bare chip is to be mounted.

4. The printed wiring board according to claim 1, wherein the plurality of corrosion resistant layer non-formation solder pads forms a plurality of electronic component mounting terminals.

5. The printed wiring board according to claim 1, wherein the plurality of corrosion resistant layer non-formation pads forms a plurality of external connecting terminals.

6. The printed wiring board according to claim 1, further comprising an OSP layer formed on the plurality of corrosion resistant layer non-formation pads.

7. The printed wiring board according to claim 1, wherein the plurality of corrosion resistant layer non-formation pads forms a flexible portions of the printed wiring board, and the plurality of corrosion resistant layer formation pads forms a stiff portion of the printed wiring board.

8. A multilayer printed wiring board, comprising:
a multilayer structure comprising a plurality of insulating layers, a plurality of conductive circuits formed on the insulating layers, a plurality of via hole conductors connecting the conductive circuits through the insulating layers;
a first solder-resist layer formed on a first surface of the multilayer structure such that the first solder-resist layer is covering a first outermost conductive circuit on the first surface of the multilayer structure, the first solder-resist layer having a plurality of openings exposing a plurality of portions of the first outermost conductive circuit such that the plurality of openings of the first solder-resist layer forms a plurality of first solder pads, respectively; and
a second solder-resist layer formed on a second surface of the multilayer structure on an opposite side with respect to the first surface of the multilayer structure such that the second solder-resist layer is covering a second outermost conductive circuit on the second surface of the multilayer structure, the second solder-resist layer having a plurality of openings exposing a plurality of portions of the second outermost conductive circuit such that the plurality of openings of the second solder-resist layer forms a plurality of second solder pads, respectively,
wherein the plurality of first solder pads includes a plurality of pads having a plurality of surface portions, respectively, and the plurality of second solder pads includes a plurality of pads having a plurality of surface portions different from the surface portions of the plurality of pads in the plurality of first solder pads, respectively, and
wherein the plurality of openings in the first solder-resist layer exposes the plurality of portions of the first conductive circuit such that the first solder-resist layer overlaps peripheral portions of the first solder pads, respectively, the plurality of openings in the second solder-resist layer exposes the plurality of portions of the second conductive circuit such that the second solder-resist layer overlaps peripheral portions of the second solder pads, respectively, the plurality of pads in the plurality of first solder pads is a plurality of corrosion resistant layer formation pads each having a corrosion resistant layer formed on one of the portions of the first conductive circuit with respect to the corrosion resistant layer formation pads, and the plurality of pads in the plurality of second solder pads is a plurality of corrosion resistant layer non-formation pads each not having a corrosion resistant layer on one of the portions of the second conductive circuit with respect to the corrosion resistant layer non-formation pads.

9. The multilayer printed wiring board according to claim 8, wherein the plurality of corrosion resistant layer formation solder pads forms a plurality of external terminals.

10. The multilayer printed wiring board according to claim 8, wherein the plurality of corrosion resistant layer formation solder pads forms a plurality of pads on which a bare chip is to be mounted.

11. The multilayer printed wiring board according to claim 8, wherein the plurality of corrosion resistant layer non-formation solder pads forms a plurality of electronic component mounting terminals.

12. The multilayer printed wiring board according to claim 8, wherein the plurality of corrosion resistant layer non-formation pads forms a plurality of external connecting terminals.

13. The multilayer printed wiring board according to claim 8, further comprising an OSP layer formed on the plurality of corrosion resistant layer non-formation pads.

14. The multilayer printed wiring board according to claim 8, wherein the via hole conductors are formed through the insulating layers, respectively.

15. The multilayer printed wiring board according to claim 14, wherein the plurality of corrosion resistant layer formation pads is formed only on an outermost insulating layer.

16. The multilayer printed wiring board according to claim 14, wherein each of the via hole conductors includes a metal material filling a space formed in each of the via hole conductors, and the metal material extends from the space formed in each of the via hole conductors such that the metal material forms a portion of a respective one of the conductive circuits.

17. The multilayer printed wiring board according to claim 8, further comprising a solder structure formed on each of the corrosion resistant layer non-formation pads.

18. The multilayer printed wiring board according to claim 8, further comprising a plurality of adhesive layers interposed between the insulating layers, respectively.

* * * * *